US011309867B2

(12) United States Patent
Urata

(10) Patent No.: US 11,309,867 B2
(45) Date of Patent: Apr. 19, 2022

(54) ACOUSTIC WAVE FILTER, MULTIPLEXER, AND COMMUNICATION APPARATUS

(71) Applicant: KYOCERA Corporation, Kyoto (JP)

(72) Inventor: Tomonori Urata, Kyotanabe (JP)

(73) Assignee: KYOCERA Corporation, Kyoto (JP)

( * ) Notice: Subject to any disclaimer, the term of this patent is extended or adjusted under 35 U.S.C. 154(b) by 326 days.

(21) Appl. No.: 16/481,309

(22) PCT Filed: Jan. 26, 2018

(86) PCT No.: PCT/JP2018/002542
§ 371 (c)(1),
(2) Date: Jul. 26, 2019

(87) PCT Pub. No.: WO2018/139598
PCT Pub. Date: Aug. 2, 2018

(65) Prior Publication Data
US 2020/0287523 A1  Sep. 10, 2020

(30) Foreign Application Priority Data
Jan. 30, 2017 (JP) .............................. JP2017-014109

(51) Int. Cl.
*H03H 9/64* (2006.01)
*H03H 9/02* (2006.01)
(Continued)

(52) U.S. Cl.
CPC ...... *H03H 9/6483* (2013.01); *H03H 9/02535* (2013.01); *H03H 9/02834* (2013.01);
(Continued)

(58) Field of Classification Search
CPC .. H03H 9/02535; H03H 9/0557; H03H 9/059; H03H 9/1085; H03H 9/1092;
(Continued)

(56) References Cited

U.S. PATENT DOCUMENTS 6,756,864 B2 * 6/2004 Muramatsu ............ H03H 7/463
333/133
6,891,449 B2 * 5/2005 Takayama ............ H03H 9/6483
310/313 B
(Continued)

FOREIGN PATENT DOCUMENTS

JP    06-061783 A  *  3/1994
JP    09-232906 A  *  9/1997
(Continued)

OTHER PUBLICATIONS

English language machine translation of JP 06-061783 A, published on Mar. 4, 1994, 5 pages. (Year: 1994).*
(Continued)

*Primary Examiner* — Barbara Summons
(74) *Attorney, Agent, or Firm* — Procopio Cory Hargreaves and Savitch LLP

(57) ABSTRACT

A SAW filter includes a substrate including a piezoelectric substrate, a transmission filter, and an additional resonator. The transmission filter is a ladder-type filter filtering signals from a transmission terminal and outputting the result to an antenna terminal. Further, the transmission filter includes one or more serial resonators and one or more parallel resonators which are connected in a ladder configuration on the piezoelectric substrate. An initial stage resonator is the serial resonator. The additional resonator includes an IDT electrode on the piezoelectric substrate. The IDT electrode is connected to the transmission terminal at a stage before the transmission filter and is connected to any of the one or more GND terminals. In the additional resonator, a resonance frequency and an antiresonance frequency are located outside of a passband of the transmission filter.

20 Claims, 12 Drawing Sheets

(51) Int. Cl.
 *H03H 9/05* (2006.01)
 *H03H 9/145* (2006.01)
 *H03H 9/25* (2006.01)
 *H03H 9/72* (2006.01)
 *H03H 9/54* (2006.01)
 *H03H 9/10* (2006.01)

(52) U.S. Cl.
 CPC .......... *H03H 9/059* (2013.01); *H03H 9/0557* (2013.01); *H03H 9/1085* (2013.01); *H03H 9/1092* (2013.01); *H03H 9/14544* (2013.01); *H03H 9/25* (2013.01); *H03H 9/542* (2013.01); *H03H 9/6479* (2013.01); *H03H 9/725* (2013.01)

(58) Field of Classification Search
 CPC ...... H03H 9/14544; H03H 9/25; H03H 9/542; H03H 9/6479; H03H 9/6483; H03H 9/725; H03H 2250/00; H03H 9/02834; H01Q 23/00
 USPC .......................................... 333/133, 193, 195
 See application file for complete search history.

(56) References Cited

U.S. PATENT DOCUMENTS

| | | | |
|---|---|---|---|
| 7,554,419 B2* | 6/2009 | Inoue | H03H 7/42 333/133 |
| 7,876,178 B2* | 1/2011 | Tamura | H03H 9/72 333/193 |
| 8,269,577 B2* | 9/2012 | Inoue | H03H 9/547 333/133 |
| 8,350,643 B2* | 1/2013 | Inoue | H03H 9/725 333/132 |
| 9,385,686 B2* | 7/2016 | Nishizawa | H03H 9/02834 |
| 9,641,155 B2* | 5/2017 | Inoue | H03H 9/725 |
| 2003/0128081 A1* | 7/2003 | Ella | H03H 9/0095 333/133 |
| 2004/0227585 A1 | 11/2004 | Taniguchi et al. | |
| 2017/0272057 A1* | 9/2017 | Takata | H03H 9/6483 |
| 2018/0131344 A1* | 5/2018 | Komatsu | H03H 9/605 |

FOREIGN PATENT DOCUMENTS

| | | |
|---|---|---|
| JP | 2004-254257 A | 9/2004 |
| JP | 2008-245310 A | 10/2008 |
| WO | WO 2016/088680 A1 * | 6/2016 |
| WO | 2017/159834 A1 | 9/2017 |

OTHER PUBLICATIONS

English language machine translation of JP 09-232906 A, published Sep. 5, 1997, 12 pages. (Year: 1997).*

* cited by examiner

ACOUSTIC WAVE FILTER, MULTIPLEXER, AND COMMUNICATION APPARATUS

TECHNICAL FIELD

The present disclosure relates to an acoustic wave filter filtering signals by utilizing an acoustic wave, a multiplexer and a communication apparatus each including the acoustic wave filter. The acoustic wave is for example a surface acoustic wave (SAW).

BACKGROUND ART

As an acoustic wave filter, there is known a ladder-type filter in which a plurality of acoustic wave resonators are connected in a ladder configuration (Patent Literature 1). Each acoustic wave resonator for example includes a piezoelectric substrate and an IDT (interdigital transducer) electrode positioned on the piezoelectric substrate.

Patent Literature 1 discloses a multiplexer having a ladder-type filter as a transmission filter. The transmission filter filters an input transmission signal and outputs the result to an antenna terminal. The multiplexer in Patent Literature 1 has a low pass filter at a stage after (antenna terminal side) the transmission filter. The capacitor of the low pass filter is configured by an IDT electrode positioned on the piezoelectric substrate.

Patent Literature 2 discloses a wiring board on which an acoustic wave filter is mounted. The acoustic wave filter mounted on the circuit board filters a transmission signal input from the wiring board and outputs the result to the wiring board. The wiring board in Patent Literature 2 has a low pass filter at a stage before the acoustic wave filter (input side to the acoustic wave filter).

CITATION LIST

Patent Literature

Patent Literature 1: Japanese Patent Publication No. 2008-245310
Patent Literature 2: Japanese Patent Publication No. 2004-254257

SUMMARY OF INVENTION

An acoustic wave filter according to one aspect of the present disclosure includes a substrate including a piezoelectric substrate, a transmission terminal, an antenna terminal, one or more reference potential terminals, a transmission filter, and an additional resonator. The transmission terminal, the antenna terminal, and the one or more reference potential terminals are positioned on the substrate. The transmission filter is a ladder-type filter filtering a signal from the transmission terminal and outputting the result to the antenna terminal. Further, the transmission filter includes one or more serial resonators and one or more parallel resonators which are connected in a ladder configuration on the piezoelectric substrate. In the transmission filter, an initial stage resonator is the serial resonator. The additional resonator includes on the piezoelectric substrate an IDT electrode which is connected to the transmission terminal in a stage before the transmission filter and is connected to any of the one or more reference potential terminals. A resonance frequency and antiresonance frequency of the additional resonator are located outside of the passband of the transmission filter.

A multiplexer according to an aspect of the present disclosure includes the acoustic wave filter described above, a reception terminal, and a receiving filter filtering the signal from the antenna terminal and outputting the result to the reception terminal.

A communication apparatus according to an aspect of the present disclosure includes an antenna, the acoustic wave filter described above in which the antenna terminal is connected to the antenna, and an IC connected to the transmission terminal.

DESCRIPTION OF EMBODIMENTS

Figure 1:
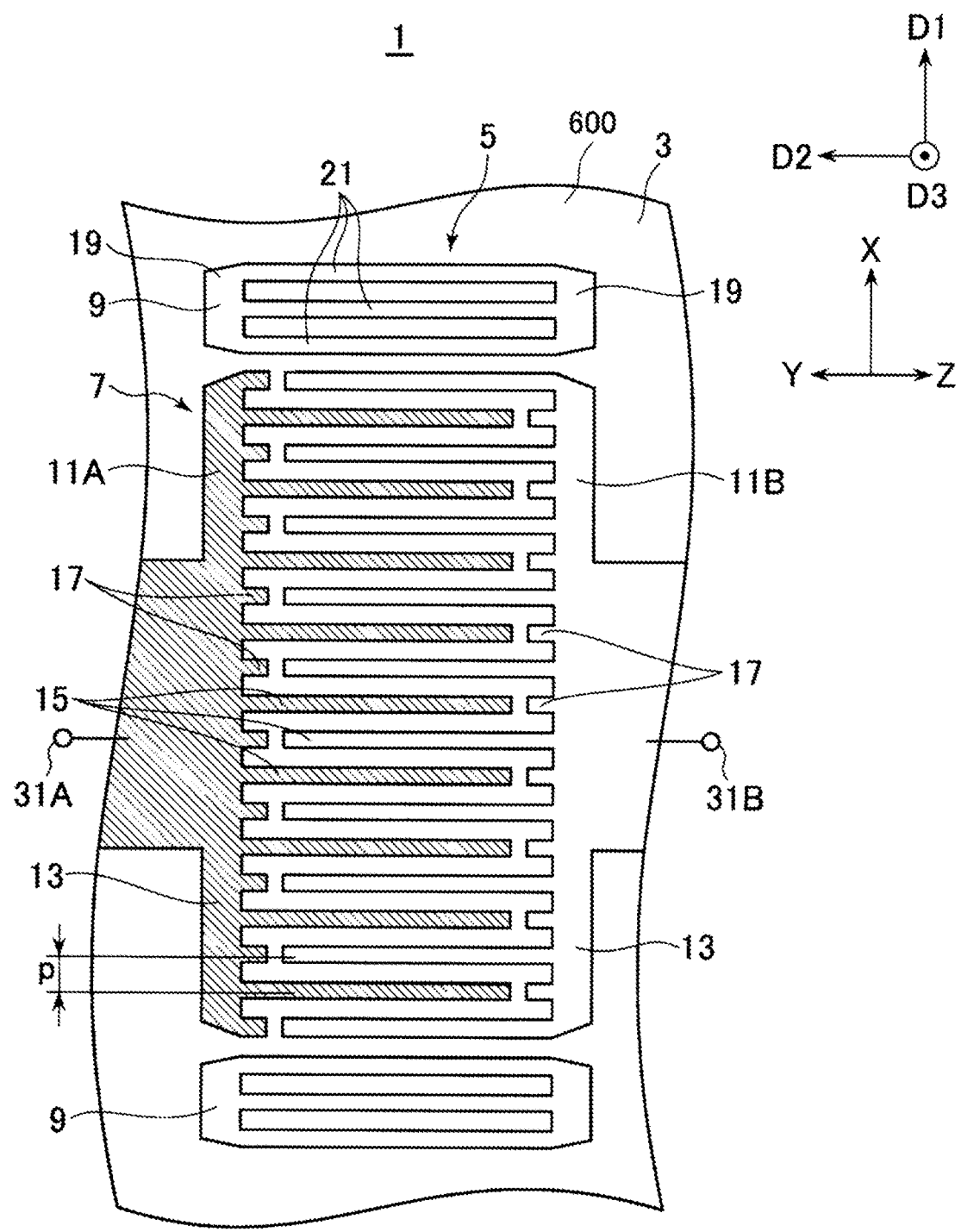
FIG. 1 is a plan view showing the configuration of a SAW resonator.

Below, embodiments of the present disclosure will be explained with reference to the drawings. Note that, the drawings used in the following explanation are schematic ones. Size ratios etc. in the drawings do not always coincide with the actual ones.

Further, sometimes the same or similar configurations will be referred to attaching different letters to the same terms such as the "first comb-shaped electrode 11A" and "second comb-shaped electrode 11B". Further, in this case, sometimes they will be simply referred to as the "comb-shaped electrodes 11" and the two will not be differentiated.

(Configuration of SAW Resonator)

FIG. 1 is a plan view showing the configuration of a SAW resonator 1 used in a SAW filter 51 (FIG. 2) according to an embodiment.

In the SAW resonator 1 (SAW filter 51), any direction may be defined as the "above" or "below". In the following explanation, however, for convenience, an orthogonal coordinate system comprised of a D1 axis, D2 axis, and D3 axis will be defined. Sometimes, "upper surface" and other terms will be used where the positive side of the D3 axis (this side on the drawing sheet in FIG. 1) is the upper part. Note that, the D1 axis is defined so as to become parallel to a direction of propagation of the SAW propagating along the upper surface of the piezoelectric substrate 3 which will be explained later (the surface on this side of the drawing sheet, usually the broadest surface (major surface surface)), the D2 axis is defined so as to be parallel to the upper surface of the piezoelectric substrate 3 and perpendicular to the D1 axis, and the D3 axis is defined so as to be perpendicular to the upper surface of the piezoelectric substrate 3.

The SAW resonator 1 configures a so-called 1-port SAW resonator. For example, it causes resonation when an electrical signal having a predetermined frequency is input from one of a first terminal 31A and second terminal 31B which are schematically shown and outputs the signal which caused the resonation from the other of the first terminal 31A and second terminal 31B.

Such a SAW resonator 1 for example has a substrate 600 (piezoelectric substrate 3 in this example) and a resonator electrode portion 5 provided on the piezoelectric substrate 3. The resonator electrode portion 5 has an IDT electrode 7 and a pair of reflectors 9 positioned on the two sides of the IDT electrode 7.

Figure 5A:
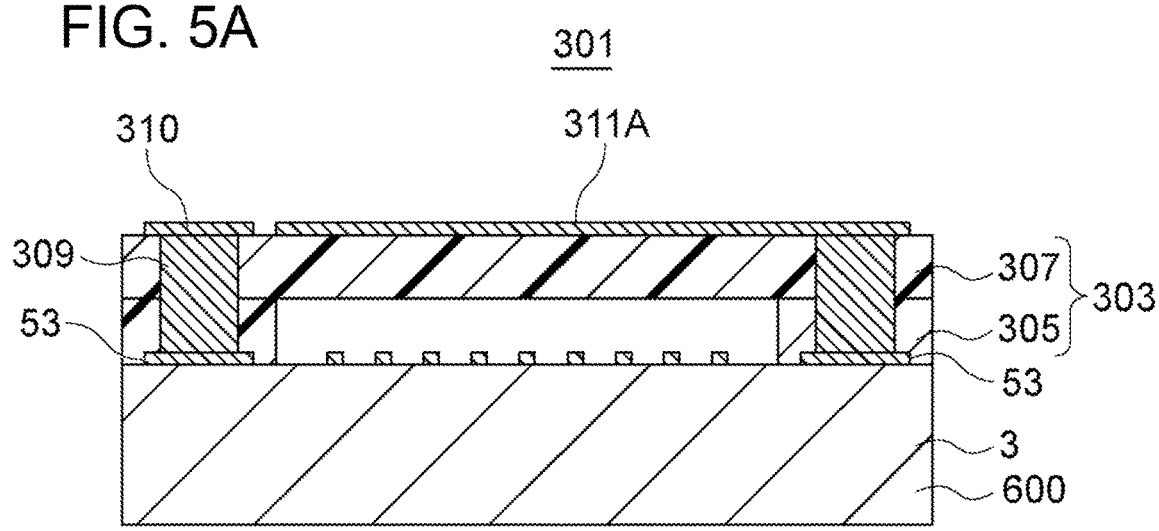
FIG. 5A and FIG. 5B are a cross-sectional view and a plan view showing an example of the SAW filter configured by packaging the SAW filter in FIG. 2.

The piezoelectric substrate 3 is for example configured by a single crystal having a piezoelectric characteristic. The single crystal is for example a lithium niobate ($LiNbO_3$) single crystal or lithium tantalate ($LiTaO_3$) single crystal. The cut angle may be suitably set in accordance with the type etc. of the SAW utilized. For example, the piezoelectric substrate 3 is a rotated Y-cut and X-propagated one. That is, the X-axis is parallel to the upper surface (D1 axis) of the piezoelectric substrate 3, while the Y-axis is inclined by a predetermined angle relative to the normal line of the upper surface of the piezoelectric substrate 3. Note that, the substrate 600 may be configured by only the piezoelectric substrate 3 as shown in FIG. 5A which will be explained later or may be configured by a piezoelectric substrate 3 which is formed relatively thin and a support substrate 4 which is made of an inorganic material or organic material and is bonded to the back surface (surface on the negative side of the D3 axis) of the piezoelectric substrate 3 as shown in FIG. 5C which will be explained later.

The IDT electrode 7 and reflectors 9 are configured by layered conductors provided on the piezoelectric substrate 3. The IDT electrode 7 and the reflectors 9 are for example configured by mutually the same materials and to mutually the same thicknesses. The layered conductors configuring them are for example metals. The metal is for example Al or an alloy containing Al as the principal ingredient (Al alloy). The Al alloy is for example an Al—Cu alloy. The layered conductors may be configured by a plurality of metal layers as well. The thicknesses of the layered conductors are suitably set in accordance with electrical characteristics etc. demanded from the SAW resonator 1. As an example, the thicknesses of the layered conductors are 50 nm to 600 nm.

The IDT electrode 7 has a first comb-shaped electrode 11A (given hatching for convenience in viewing) and second comb-shaped electrode 11B. The comb-shaped electrodes 11 have bus bars 13, pluralities of electrode fingers 15 which extend parallel to each other from the bus bars 13, and pluralities of dummy electrode fingers 17 each projecting from the bus bar 13 between the two or more electrode fingers 15. The pair of comb-shaped electrodes 11 are arranged so that the pluralities of electrode fingers 15 intermesh (intersect) with each other. That is, the two bus bars 13 in the pair of comb-shaped electrodes 11 are arranged so as to face each other, and the electrode fingers 15 in the first comb-shaped 11A and the electrode fingers 15 in the second comb-shaped electrode 11B are basically alternately aligned in the width direction thereof. Further, the plurality of dummy electrodes in one comb-shaped 11 face at their tip ends with the tip ends of the electrode fingers 15 in the other comb-shaped electrode 11.

The bus bars 13 are for example substantially formed in long shapes so as to linearly extend in a direction of propagation of the SAW (D1 axis direction) with constant widths. Further, the pair of bus bars 13 face each other in a direction (D2 axis direction) perpendicular to the direction of propagation of the SAW. Note that, the bus bars 13 may be changed in the widths or inclined relative to the direction of propagation of the SAW.

The electrode fingers 15 are for example substantially formed in long shapes so as to linearly extend in the direction (D2 axis direction) perpendicular to the direction of propagation of the SAW with constant widths. The plurality of electrode fingers 15 are for example aligned in the direction of propagation of the SAW. Further, they have equal lengths to each other. Note that, the IDT electrode 7 may be so-called apodized so that the lengths of the plurality of electrode fingers 15 (intersecting widths from another viewpoint) change according to the positions in the propagation direction.

The number of the electrode fingers 15 may be suitably set in accordance with the electrical characteristics etc. demanded from the SAW resonator 1. Note that, FIG. 1 etc. are schematic views, therefore a smaller number of electrode fingers 15 are shown. In actuality, a larger number (for example 100 or more) electrode fingers 15 than those shown in the view may be aligned. The same is true for the later explained strip electrodes 21 in the reflectors 9.

A pitch "p" of the plurality of electrode fingers 15 (electrode finger pitch) is for example made substantially constant over the entire IDT electrode 7. Note that, the pitch "p" is for example a distance between the centers of mutually neighboring two electrode fingers 15 (or strip electrodes 21 which will be explained later). The pitch "p" is basically set to a half of the wavelength λ ($p=\lambda/2$) of a SAW having an equal frequency to the frequency at which resonation is desired to be caused among SAWs propagating on the piezoelectric substrate 3.

The pluralities of dummy electrodes 17 are for example substantially formed in long shapes so as to linearly project to the direction (D2 axis direction) perpendicular to the direction of propagation of the SAW with constant widths. A gap between the tip end thereof and the tip end of each of the plurality of electrode fingers 15 is for example equal among the plurality of dummy electrodes 17. The width, number, and pitch of the plurality of dummy electrodes 17 are equal to those of the plurality of electrode fingers 15. Note that, the width of the dummy electrodes 17 may be different from the electrode fingers 15 as well. The IDT electrode 7 may be one which does not have a dummy electrode 17. In the following explanation, the explanation and illustration of the dummy electrodes 17 will be sometimes omitted.

Each reflector 9 is for example formed in a lattice shape. That is, the reflector 9 has a pair of bus bars 19 facing each other and pluralities of strip electrodes 19 which extend between the pair of bus bars 19.

The shapes of the bus bars 19 and strip electrodes 21 may be made the same as the bus bars 13 and electrode fingers 15 in the IDT electrode 7 except that the two ends of each strip electrode 21 are connected to the pair of bus bars 19.

For example, the bus bars 19 are substantially formed in long shapes so as to linearly extend in the direction of propagation of the SAW (D1 axis direction) with constant widths. The strip electrodes 21 are substantially formed in long shapes so as to linearly extend in the direction (D2 axis direction) perpendicular to the direction of propagation of the SAW with constant widths. Further, the plurality of strip electrodes 21 are for example aligned in the direction of propagation of the SAW. Further, they have equal lengths to each other. The width and pitch of the plurality of strip electrodes 21 are for example equal to the width and pitch of the plurality of electrode fingers 15.

The number of the plurality of strip electrodes 21 is for example set so that the reflectivity of the SAW in a mode designed for use becomes substantially 100% or more. The theoretical necessary minimum number is for example several to about 10. Usually, it is set to 20 or 30 or more providing a safety margin.

The pair of reflectors 9 are for example adjacent to the two sides of the IDT electrode 7 in the direction of propagation of the SAW. Accordingly, the pluralities of strip electrodes 21 are aligned continuing from the arrangement of the plurality of electrode fingers 15. The pitch between a strip electrode 21 and an electrode finger 15 which are adjacent to each other between a reflector 9 and the IDT electrode 7 is for example equal to the pitch of the plurality of electrode fingers 15.

Note that, the upper surface of the piezoelectric substrate 3 may be covered by a protective film 23 (FIG. 6A) comprised of $SiO_2$ or the like from the tops of the IDT electrode 7 and reflectors 9 as well. Further, in a case where the protective film 23 is provided or another case, on the upper surfaces or lower surfaces of the IDT electrode 7 and reflectors 9, addition-films configured by insulators or metal may be provided in order to improve the reflection coefficient of the SAW.

When voltage is supplied to the pair of comb-shaped electrodes 11, voltage is supplied to the piezoelectric substrate 3 by the electrode fingers 15, and a SAW in a predetermined mode propagating in the direction of the D1 axis along the upper surface is excited in the vicinity of the upper surface of the piezoelectric substrate 3. The excited SAW is mechanically reflected by the electrode fingers 15. As a result, a standing wave having the pitch of the electrode fingers 15 as a half wavelength is formed. The standing wave is converted to an electrical signal having the same frequency as that of the standing wave and is extracted by the electrode fingers 15. In this way, the SAW resonator 1 functions as the resonator. The resonance frequency thereof is substantially the same frequency as the frequency of the SAW propagating on the piezoelectric substrate 3 while having the pitch of the electrode fingers as a half wavelength.

The SAW excited in the IDT electrode 7 is mechanically reflected by the strip electrodes 21 in the reflectors 9. Further, the mutually neighboring strip electrodes 21 are connected to each other by the bus bars 19, therefore the SAW from the IDT electrode 7 is reflected by the strip electrodes 21 electrically as well. Due to this, dispersion of the SAW is suppressed and a strong standing wave stands in the IDT electrode 7, so the function of the SAW resonator 1 as the resonator is improved.

Note that, when referring to the "connection" for the SAW resonator 1 (or additional resonator 57 which will be explained later), unless particularly explained other, as schematically shown by the first terminal 31A and second terminal 31B, it means a connection by which a voltage is supplied to the pair of comb-shaped electrodes 11.

In the IDT electrode 7, for improvement of characteristics or fine adjustment, sometimes a pitch of electrode fingers having a size different from the pitch of most of the electrode fingers is set in a portion thereof (for example less than 50%, more preferably less than 5% of the total number of the electrode fingers). For example, in the IDT electrode 7, at the two sides of the direction of propagation of the SAW, sometimes a narrow pitch portion having a smaller electrode finger pitch than that in the other most parts is provided. Further, for example, sometimes so-called thinning is carried out so that one to about tens (for example three) of the alternately aligned electrode fingers 15 in the pair of comb-shaped electrodes 11 are removed or a change of the width or arrangement of the electrode fingers 15 which is substantially equivalent to the former is carried out. When simply referred to as the "pitch" in the present disclosure, the pitch in such a unique portion is excluded. Further, in the case that the pitch fluctuates within a very small range over the entire IDT electrode 7, a mean value thereof may be used.

(Configuration of SAW Filter)

Figure 2:
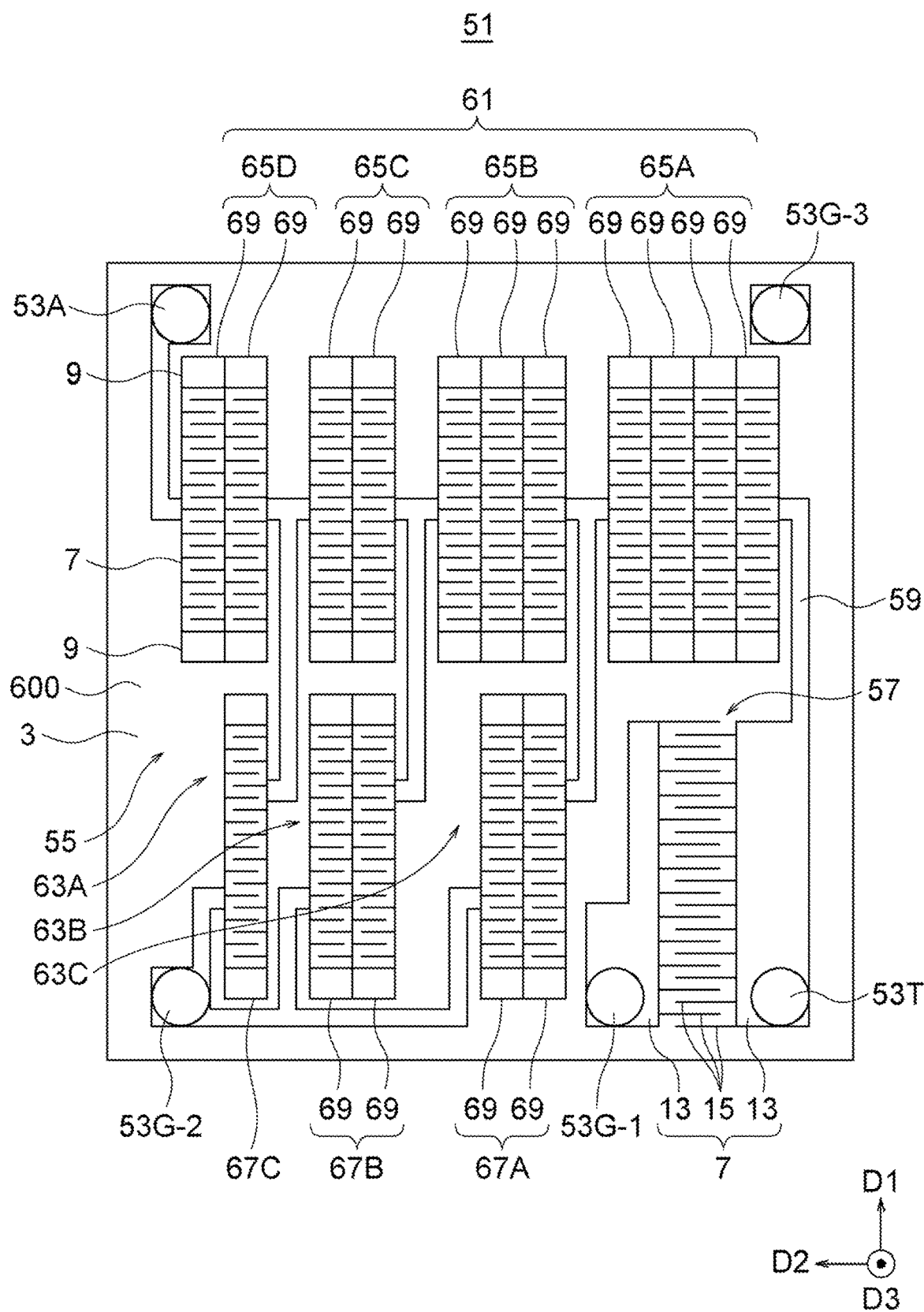
FIG. 2 is a plan view schematically showing the configuration of a SAW filter including the SAW resonator in FIG. 1.

FIG. 2 is a plan view schematically showing the configuration of a SAW filter 51 including the SAW resonator 1. In this view, as understood from the notations of the IDT electrode 7 and reflectors 9 shown on the left top side on the drawing sheet, these conductors are further schematically shown than those in FIG. 1.

The SAW filter 51, for example, in wireless communications, is configured as a filter filtering signals to be transmitted. The SAW filter 51 has the already explained piezoelectric substrate 3 and, on the piezoelectric substrate 3, has a transmission terminal 53T, antenna terminal 53A, GND terminals 53G-1 to 53G-3, transmission filter 55, additional resonator 57, and wirings 59.

Note that, in the following description, sometimes the GND terminals 53G-1 to 53G-3 will not be differentiated and will simply be referred to as the "GND terminals 53G". Further, sometimes the transmission terminal 53T, antenna terminal 53A, and GND terminal 53G will not be differentiated and will be simply referred to as the "terminals 53".

The transmission terminal 53T is for example a terminal connected to a circuit which generates a transmission signal. The antenna terminal 53A is a terminal connected to the antenna. The GND terminal 53G is a terminal given a reference potential (grounded). The transmission filter 55 filters signals input to the transmission terminal 53T and outputs the result to the antenna terminal 53A. At this time, unwanted components (signals out of the passband) are made to flow to the GND terminal 53G. The additional resonator 57 for example contributes to protection of the transmission filter 55 from heat.

The terminals 53 and a portion of the wirings 59 only have to be basically positioned on a substrate 600. In this example, the terminals 53 and the wirings 59 are configured by layered conductors which are positioned on the upper surface of the piezoelectric substrate 3. Their specific numbers, shapes, sizes, and positions may be suitably set. The terminals 53 and wirings 59 are for example configured by conductor layers which are the same as each other (materials and thicknesses are same as each other). However, at the positions of the terminals 53, a conductor layer configured by another material may be formed on a conductor layer common to the terminals 53 and wirings 59 as well. Naturally the terminals 53 and the wirings 59 may be configured by materials different from each other.

Note that, the terminals 53 need not be able to be differentiated from the wirings 59 by their own configurations (shapes or materials etc.) and may be formed as if they were portions of the wirings 59. For example, the positions or ranges of the terminals 53 may be specified by the insulation layer (for example protective film 23) which covers the wirings 59, but does not cover the terminals 53 or may be specified by members (for example bumps) which abut against the terminals 53 when the piezoelectric substrate 3 is packaged.

(Configuration of Transmission Filter)

The transmission filter 55 is configured by a so-called ladder-type SAW filter. That is, the transmission filter 55 has a serial arm 61 and one or more parallel arms 63 (first parallel arm 63A to third parallel arm 63C in the example shown). The serial arm 61 connects the transmission terminal 53T and the antenna terminal 53A and contributes to transmission of signals in the passband. A parallel arm 63 connects the serial arm 61 and the GND terminal 53G and contributes to the flow of signals out of the passband to the GND terminal 53G. Note that, in the explanation of the present embodiment, basically a case where there are a plurality of parallel arms 63 will be taken as an example.

The serial arm 61 includes a plurality of serial resonators 65 (first serial resonator 65A to fourth serial resonator 65D in the example shown) which are connected in series between the transmission terminal 53T and the antenna terminal 53A. Note that, it is also possible to make the number of serial resonators 65 a single one. The parallel arms 63 have parallel resonators 67 (first parallel resonator 67A to third parallel resonator 67C in the example shown) which connect the input sides of the corresponding serial resonators 65 (here, the transmission terminal 53T sides) or output sides (here, the antenna terminal 53A sides) and the GND terminal 53G. The plurality of parallel arms 63 (parallel resonators 67) are connected to the serial arm 61 at positions which are electrically different from each other (positions which are different from each other in relative relationships with respect to the serial resonators 65).

Note that, the connection in the aspect as described above in which two input- or output-use terminals (53T and 53A) are connected by the serial arm 61 (from another viewpoint, one or more serial resonators 65) and in which the serial arm 61 and the GND terminals 53G are connected by one or more parallel arms 63 (from another viewpoint, one or more parallel resonators 67) will be referred to as a ladder-type connection.

In the present embodiment, the initial stage resonator (closest to the input side (transmission terminal 53T side)) in the transmission filter 55 becomes a serial resonator 65 (first serial resonator 65A). That is, there is no parallel resonator 67 which is connected on the transmission terminal 53T side with respect to the first serial resonator 65A (from another viewpoint, all serial resonators 65). Note that, if unlike the illustration there is a parallel resonator 67 which is connected to the transmission terminal 53T side of the first serial resonator 65A, the initial stage resonator is the parallel resonator 67. The resonator at the rearmost stage (antenna terminal 53A side) may be a serial resonator 65 (example shown) or may be a parallel resonator 67.

Note that, in the SAW filter 51, it is possible to specify from for example the specifications etc. of the SAW filter 51 which terminal between the two terminals (53T and 53A) provided for input/output is the transmission terminal 53T or antenna terminal 53A (from another viewpoint, the direction in which the signal to be passed therethrough is propagated). Further, as apparent also from designation of the transmission terminal and antenna terminal in the specification, usually the characteristics of the transmission filter 55 fall when the transmission terminal 53T and the antenna terminal 53A are switched with each other. That is, the transmission terminal 53T and the antenna terminal 53A can be differentiated from the specific configuration (design values etc.) of the transmission filter 55.

Each of the serial resonators 65 and parallel resonators 67 is for example configured by a SAW resonator 1 explained with reference to FIG. 1. However, specific values such as the number of the electrode fingers 15, length of the electrode fingers 15 and/or pitch "p" are set in accordance with the characteristics demanded from each resonator.

Each of the serial resonators 65 and parallel resonators 67 may be configured by a single SAW resonator 1 or may be configured by a plurality of SAW resonators 1. In the example shown, the third parallel resonator 67C is configured by one SAW resonator 1, while each resonator other than this is configured by a plurality of SAW resonators 1 (69).

Note that, the resonators other than the third parallel resonator 67C may be grasped as if one SAW resonator 1 were divided into a plurality of SAW resonators 1 to configure the same. In the following description, when one serial resonator 65 or one parallel resonator 67 is configured by a plurality of SAW resonators 1, these SAW resonators 1 will be referred to as "divided resonators 69".

In each of the serial resonators 65 or parallel resonators 67, the plurality of divided resonators 69 are connected in series with each other. The connection may be carried out by a wiring 59 or may be carried out by sharing a bus bar 13. In each of the serial resonators 65 or parallel resonators 67, the plurality of divided resonators 69 are for example substantially given the same configurations as each other. However, the plurality of divided resonators 69 may be given mutually different configurations as well.

In this way, by dividing one serial resonator 65 or one parallel resonator 67, for example, the voltage supplied to one SAW resonator 1 (each divided resonator 69) is lowered, and it is possible to improve the electric power resistance in one serial resonator 65 as a whole or one parallel resonator 67 as a whole.

Note that, when there are a plurality of SAW resonators 1 connected in series in the serial arm 61, for example, it is possible to specify using the connection position with the parallel arm 63 as the reference whether each SAW resonator 1 is a divided resonator 69 or one solely configuring a serial resonator 65. For example, if the parallel arm 63 is not connected between the two SAW resonators 1 which are connected in series to each other, those two SAW resonators 1 are divided resonators 69 configuring one serial resonator 65 together.

The numbers of division of the serial resonators 65 are for example different from each other among the plurality of serial resonators 65. The first serial resonator 65A of the initial stage resonator becomes for example one of the serial resonators 65 having the largest number of division. More specifically, for example, the number of division of the serial resonator 65 becomes larger toward the transmission terminal 53T side. Further, for example, the first serial resonator 65A is larger in number of division than any other serial resonator 65. However, the numbers of division may be the same as each other among the plurality of serial resonators 65. Otherwise, when the numbers of division are different from each other among the plurality of serial resonators 65, a serial resonator 65 having a larger number of division than the number of division of the first serial resonator 65A may be present as well.

Note that, although not particularly shown, a capacitor connected parallel to the serial resonator 65 or parallel resonator 67 or an inductor (see FIG. 10) connected in series between the parallel resonator 67 and the GND terminal 53G may be provided as well. Further, the combination of such a capacitor and/or inductor and the SAW resonator 1 (serial resonator 65 or parallel resonator 67) as a whole may be grasped as a serial resonator or parallel resonator.

In FIG. 2, for convenience of explanation, the plurality of serial resonators 65 and plurality of parallel resonators 67 are neatly arranged. However, in actuality, they need not be neatly arranged in this way. Further, in FIG. 2, the wirings 59 are connected to the bus bars 13 (see FIG. 1) only at a portion in the D1 axis direction. However, the wirings 59 may be connected to the bus bars 13 in the serial resonators 65 or parallel resonators 67 over substantially the entirety in the D1 axis direction as well. From another viewpoint, the boundaries between the wirings 59 and the bus bars 13 need not be clear either.

(Configuration of Additional Resonator)

The additional resonator 57 is connected to the transmission terminal 53T at a stage before (input side) the transmission filter 55 (from another viewpoint, the first serial resonator 65A of the initial stage resonator) and is connected to the GND terminal 53G-1. Accordingly, for example, a heat dissipation route is formed from the transmission terminal 53T to the GND terminal 53G-1, therefore the transmission filter 55 is protected from heat. Note that, the additional resonator 57, when looking only at the connection configuration thereof, looks like a parallel resonator 67 in the ladder-type filter (transmission filter 55). However, as will be explained later, it is different in resonance frequency and antiresonance frequency from the parallel resonator 67 and does not configure a ladder-type filter.

The additional resonator 57 only have to be electrically connected to the transmission terminal 53T at a stage before the transmission filter 55, and the connection position when viewed from a plane of the piezoelectric substrate 3 (connection position from structural viewpoint) may be suitably set. For example, when an wiring 59 is provided looking as if it were extending from the additional resonator 57, this wiring 59 may be connected to any of the wiring 59 connecting the transmission filter 55 and the transmission terminal 53T, the bus bar 13 on the front stage side of the first serial resonator 65A, and the transmission terminal 53T.

The additional resonator 57, for example, as schematically shown in FIG. 2, is configured by an IDT electrode 7. In other words, the additional resonator 57 is configured as an SAW resonator 1 from which the pair of reflectors 9 are removed. Since the pair of reflectors 9 are not provided, in the additional resonator 57, for example, the function as a resonator falls. As a result, the significance as the capacitance element relatively becomes larger. However, the additional resonator 57 may have a pair of reflectors 9 as well. Further, a solid pattern conductor may be arranged on the two sides of the additional resonator 57 in the direction of propagation of the SAW so as to reduce leakage of the SAW from the additional resonator 57. Further, the additional resonator 57 may be configured as an IDT electrode 7 from which the dummy electrodes 17 are removed as well.

The relative positions on the piezoelectric substrate 3 of the additional resonator 57 (its IDT electrode 7), transmission terminal 53T, and GND terminal 53G-1 and the shapes of the wirings connecting them may be suitably set.

For example, the transmission terminal 53T and the GND terminal 53G-1 are positioned on the two sides of the additional resonator 57 in the direction (D2 axis direction) perpendicular to the direction of propagation of the SAW and fall in the range of arrangement of the additional resonator 57 in the direction of propagation of the SAW (D1 axis direction). Further, for example, the transmission terminal 53T and the GND terminal 53G-1 are substantially equal to each other in positions in the D1 axis direction (ranges of arrangement overlap with each other in the D1 axis direction). The shortest distance between the transmission terminal 53T and/or the GND terminal 53G-1 and the additional resonator 57 is for example less than the length of the electrode fingers 15 in the additional resonator 57. Note that, when the boundaries between the wirings 59 and the bus bars 13 are not clear, the shortest distance described above may be found using the edge part of the bus bar 13 on the electrode finger 15 side (inner side of the IDT electrode 7) as the standard. By one or more of the configurations as described above, for example, the heat dissipation route from the transmission terminal 53T to the GND terminal 53G-1 becomes shorter.

Further, for example, the wiring 59 connecting the transmission terminal 53T and the additional resonator 57 is made relatively broader in its width (D1 axis direction). For example, this width is made not less than the diameter of the transmission terminal 53T and further may be made equal to the length of the bus bar 13 in the additional resonator 57. Also, the width of the wiring 59 (D1 axis direction) connecting the GND terminal 53G-1 and the additional resonator 57 may be made the same. That is, this width may be made the diameter of the GND terminal 53G-1 or more and further may be made equal to the length of the bus bar 13 in the additional resonator 57.

The GND terminal 53G-1 connected to the additional resonator 57 is for example not a GND terminal 53G (53G-2 in the example shown) which is connected to the serial arm 61 (from another viewpoint, the transmission terminal 53T and the antenna terminal 53A) through any of the one or more parallel resonators 67. Further, the GND terminal 53G-1 is not short-circuited with (electrically separated from) such a GND terminal 53G-2 that is connected through a parallel resonator 67 to the serial arm 61. That is, the GND terminal 53G-1 is connected with the GND terminal 53G-2 through an electronic element such as an SAW resonator 1, but is not connected with the other GND terminal 53G only through an wiring 59.

Note that, short-circuiting (unintended ones excluded) basically means for example connection by a conductor formed for the purpose of connection like connection by the wirings 59. From another viewpoint, it means connection without going through an electronic element (resistor, capacitor, inductor, etc.). The conductor formed for the purpose of connection such as the wirings 59 strictly speaking has a resistance value, capacitance, and inductance. However, these are not considered here.

The piezoelectric substrate 3, as will be explained later, is packaged or connected with another circuit board. The GND terminal 53G-1, for example, is not short-circuited with the GND terminal 53G-2 even by a package or by the other circuit board.

However, the GND terminal 53G-1 may be connected to the serial arm 61 through the parallel resonator 67 like the GND terminal 53G-2 or may be short-circuited with the GND terminal 53G-2 through an wiring 59, package, and/or circuit board.

The terminals 53, wirings 59, the electrodes of the serial resonators 65, the electrodes of the parallel resonators 67, and the electrodes of the additional resonator 57 are for example configured by the same conductor layer as each other (the materials and thicknesses are the same as each other). However, they may also be configured by materials different from each other or another conductor layer may be formed on a conductor layer common to them only in a portion of them.

Although not particularly shown, on the piezoelectric substrate 3, configurations other than those described above may be provided as well. For example, a low pass filter may be provided between the antenna terminal 53A and the transmission filter 55.

(Frequency Characteristics of Resonators)

Figure 3:
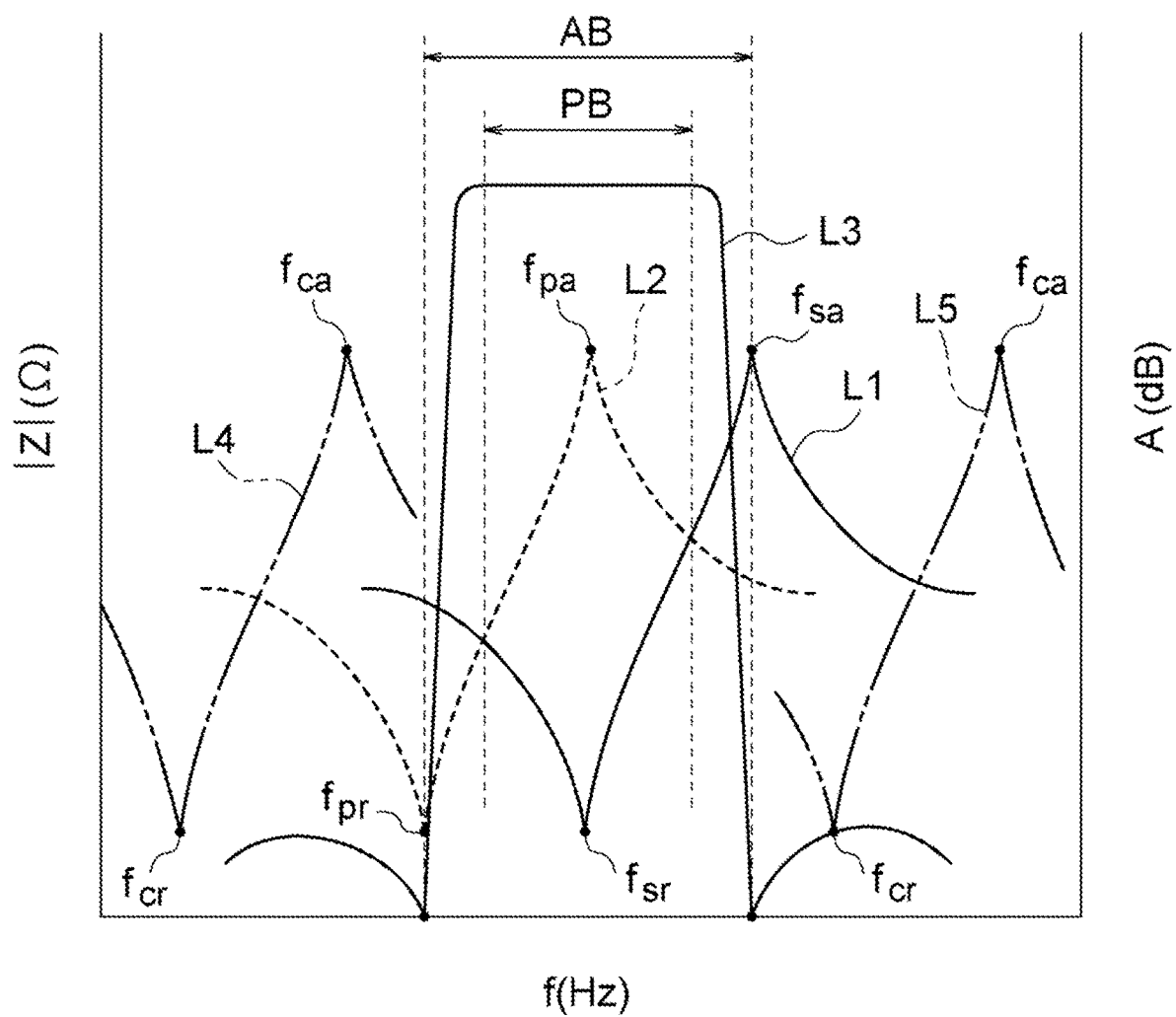
FIG. 3 is a view showing frequency characteristics of a transmission filter and an additional resonator in the SAW filter in FIG. 2.

FIG. 3 is a view showing the frequency characteristics of the transmission filter 55 and additional resonator 57.

In this graph, an abscissa shows the frequency "f" (Hz), and an ordinate shows the absolute value $|Z|(\Omega)$ of impedance or attenuation amount A (dB). A line L1 indicates the impedance of the serial resonator 65. A line L2 indicates the impedance of the parallel resonator 67. A line L3 indicates the attenuation amount of the transmission filter 55. A line L4 or line L5 indicates the impedance of the additional resonator 57.

In the frequency characteristic of impedance according to the SAW resonator 1 (serial resonator 65, parallel resonator 67), a resonance point at which the impedance becomes the minimum value and an antiresonance point at which the impedance becomes the maximum value appear. The frequencies at which the resonance point and antiresonance point appear will be defined as resonance frequencies (fsr, fpr) and antiresonance frequencies (fsa, fpa). In the SAW resonator 1, the antiresonance frequency is higher than the resonance frequency.

In the serial resonator 65 and parallel resonator 67, the resonance frequencies and antiresonance frequencies are set so that the resonance frequency fsr of the serial resonator 65 (line L1) and the antiresonance frequency fsa of the parallel resonator 67 (line L2) substantially coincide. Due to this, the transmission filter 55 (line L3) functions as a filter having a range which is somewhat narrower than the frequency range (attenuation band AB) from the resonance frequency fpr of the parallel resonator 67 up to the antiresonance frequency fsa of the serial resonator 65 as the passband PB.

Accordingly, the resonance frequency fsr of the serial resonator 65 is positioned in the passband PB of the transmission filter 55. Further, the antiresonance frequency fpa of the parallel resonator 67 is positioned in the passband PB of the transmission filter 55.

The specific frequencies in the passband PB are any values. For example, the passband PB is positioned at 2.7 GHz or less. As the system utilizing such a frequency band, for example, there can be mentioned a mobile phone system and digital TV broadcast system. Naturally the passband PB may be higher than 2.7 GHz or may straddle 2.7 GHz.

The additional resonator 57 (line L4 or line L5) is configured by an IDT electrode 7. Therefore, in the same way as the SAW resonator 1, it has a resonance frequency fcr and antiresonance frequency fca. However, both of the resonance frequency fcr and antiresonance frequency fca are positioned outside of the passband PB. From another viewpoint, although the additional resonator 57 is the same in connection configuration as the parallel resonator 67, it does not have a frequency characteristic capable of configuring a ladder-type filter (transmission filter 55) in the relationships with the frequency characteristics of the serial resonator 65 and the other parallel resonator 67.

Note that, in the frequency characteristic of impedance of the additional resonator 57, in actuality, a plurality of minimum values and plurality of maximum values appear. The resonance frequency fcr referred to here is the frequency which becomes the frequency of the SAW where in theory $\lambda=2p$. Further, the antiresonance frequency fca is a frequency becomes $fcr\times\sqrt{(1+(C_1/C_0))}$ in theory, where the capacitance of the serial resonance circuit is $C_1$ and the capacitance of the parallel resonance circuit is $C_0$ in the equivalent circuit of the additional resonator 57.

Further, when judging whether the resonance frequency fcr or antiresonance frequency fca is positioned in the passband PB, the passband PB may be suitably specified. For example, the passband PB may be specified according to computations based on the design values (theoretical computations or simulation computations), may be specified according to an evaluation test with respect to an actual product, or may be specified based on the specifications etc. of an actual product.

In FIG. 3, the frequency characteristic of the additional resonator 57 is indicated by a waveform obtained by shifting the frequency characteristics of the serial resonator 65 and parallel resonator 67 along the abscissa. However, the additional resonator 57 is not one configuring the transmission filter 55, therefore the waveform showing the frequency characteristic of the additional resonator 57 may be quite different from the waveforms showing the frequency characteristics of the serial resonator 65 and parallel resonator 67. For example, in the additional resonator 57, the impedance at the resonance frequency, the impedance at the antiresonance frequency, a frequency difference ($\Delta f$) between the resonance frequency and the antiresonance frequency, and/or various conditions defining them (electrode finger pitch, duty ratio (ratio of the width of the electrode fingers 15 relative to the electrode finger pitch), length of the electrode fingers 15 and/or electrostatic capacitance etc.) may be different from those of the serial resonator 65 and parallel resonator 67.

For example, the electrostatic capacitance of the additional resonator 57 is different from the electrostatic capacitance of any of the parallel resonators 67. For example, the former is larger than the latter. In this case, for example, the additional resonator 57, compared with the parallel resonator 67, is made longer in the electrode fingers 15, is made larger in the number of the electrode fingers 15, and/or is made smaller in the electrode finger pitch and thereby is made relatively larger in electrostatic capacitance. Note that, when the electrode finger pitches are compared between the additional resonator 57 and the parallel resonator 67, as already referred to, some special parts (narrow pitch portions or thinned-out portions) may be ignored. Otherwise, when the electrode finger pitch changes as a whole, they may be compared in mean values.

Further, in FIG. 3, the resonance frequency fcr and antiresonance frequency fca of the additional resonator 57 are shown at positions which are relatively close to the passband PB. However, the resonance frequency fcr and antiresonance frequency fca may be separated from the passband PB more than those shown in the graph. For example, the resonance frequency fcr and antiresonance frequency fca may be positioned outside of the attenuation band AB. Note that, the attenuation band AB may also be suitably specified in the same way as the passband PB. Further, for example, the resonance frequency fcr and antiresonance frequency fca may be separated relative to the passband PB by a frequency difference of the width of the passband PB or more as well.

(Packaged SAW Filter)

The SAW filter 51 may be assembled in an electronic apparatus as it is (as a bare chip as it is) and utilized. However, the SAW filter 51 may be packaged as well. In the following description, examples of a package will be shown.

(Example 1 of Package)

Figure 4:
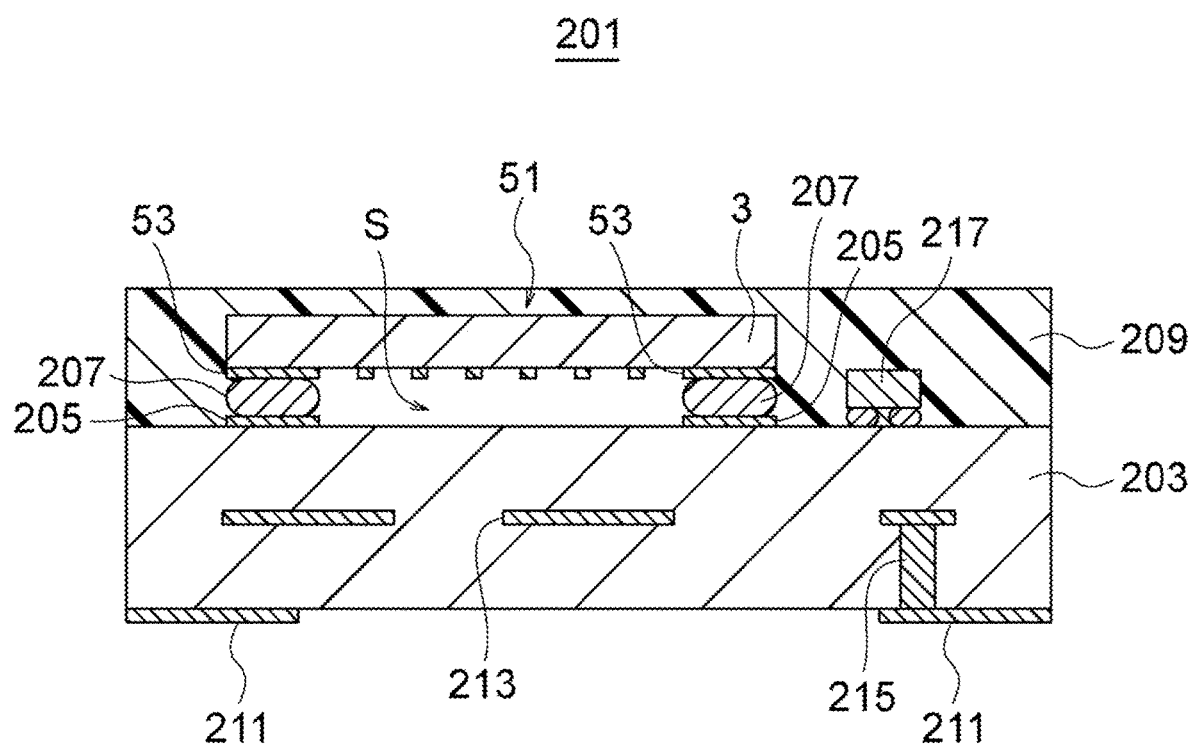
FIG. 4 is a cross-sectional view showing an example of a SAW filter configured by packaging the SAW filter in FIG. 2.

FIG. 4 is a cross-sectional view showing a SAW filter 201 configured by packaging the SAW filter 51.

In the SAW filter 201, the piezoelectric substrate 3 in the SAW filter 51 is arranged so as to face a facing substrate 203 across a gap. Further, the terminals 53 and the pads 205 on the facing substrate 203 are bonded by bumps 207 interposed therebetween. Due to this, on the transmission filter 55, a vibration space S facilitating the propagation of the SAW (vibration of the piezoelectric substrate 3) is formed. The vibration space S, on the facing substrate 203, is sealed by a sealing portion 209 made of resin or the like which is arranged on the periphery of the SAW filter 51.

On the surface of the facing substrate 203 on the side opposite to the surface on which the SAW filter 51 is mounted, external terminals 211 for mounting the SAW filter 201 on a circuit board or the like by bumps are provided. The pads 205 and the external terminals 211 are electrically connected by wiring conductors (notations are omitted) of the facing substrate 203. The wiring conductors are for example configured by layered conductor patterns 213 formed along the facing substrate 203 in the internal portion or on the surface of the facing substrate 203 (its insulation substrate) and via conductors 215 penetrating through the facing substrate 203 in the thickness direction thereof.

In the SAW filter 201, electronic elements other than the SAW filter 51 may be provided as well. For example, the conductor pattern 213 may configure a capacitor or inductor or another electronic element by being given a suitable planar shape. Further, for example, on the facing substrate 203, an electronic element other than the SAW filter 51 (for example an electronic component 217) may be mounted as well. The electronic component 217 is for example a chip-shaped component and is for example a capacitor, inductor, or IC (integrated circuit).

Note that, unlike the example shown, the electronic component 217 other than the SAW filter 51 need not be mounted on the facing substrate 203 and the size of the facing substrate 203 may be made as small as possible relative to the size of the piezoelectric substrate 3. From another viewpoint, the SAW filter 201 may be formed as a chip size package type component as well.

The terminal 53 of the SAW filter 51 and an external terminal 211 are for example directly connected (short-circuited) by an wiring conductor in the facing substrate 203. However, in a case where an electronic element is configured by a conductor pattern 213 or an electronic element (electronic component 217) other than the SAW filter 51 is mounted on the facing substrate 203, such an electronic element may be interposed between the terminal 53 and the external terminal 211 as well.

Note that, the GND terminal 53G which is connected to the additional resonator 57 in the SAW filter 51 may be led out to the external terminal 211 without short-circuiting with the other GND terminal 53G even in the facing substrate 203.

(Example 2 of Package)

FIG. 5A is a cross-sectional view showing a SAW filter 301 configured by packaging the SAW filter 51.

In the SAW filter 301, a cover 303 is provided on the piezoelectric substrate 3 of the SAW filter 51. The cover 303 has a frame 305 surrounding at least the transmission filter 55 on the piezoelectric substrate 3 and a lid 307 which is positioned on the frame 305 and closes the opening of the frame 305. Due to this, on the transmission filter 55, a vibration space S facilitating the propagation of the SAW (vibration of the piezoelectric substrate 3) is formed. Note that, when viewed on a plane, the additional resonator 57 may be positioned in the frame 305 or may be superposed on the frame 305 (explained later).

On the terminals 53, columnar terminals 309 penetrating through the cover 303 are provided. The upper surface side portions of the columnar terminals 309 become lands 310 for mounting the SAW filter 301 on a circuit board or the like by bumps. Note that, the columnar terminals 309 need not be provided. Via holes penetrating through the cover 303 may be provided on the terminals 53. In this case, for example, the terminals 53 and the circuit board or the like are bonded by the bumps.

Figure 5B:
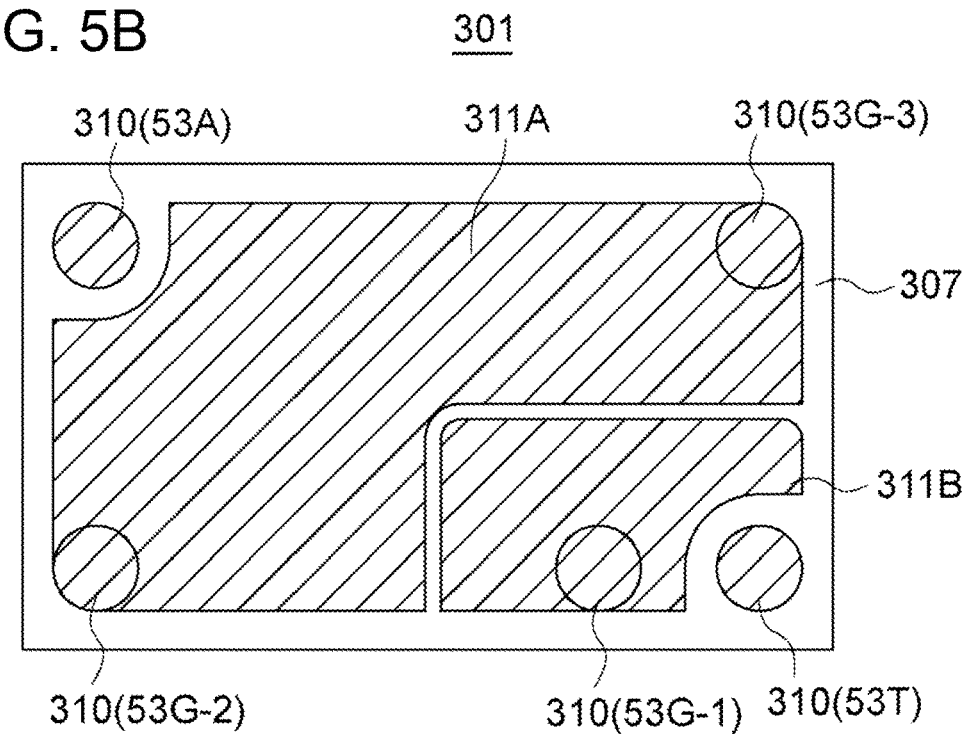
Figure 5C:
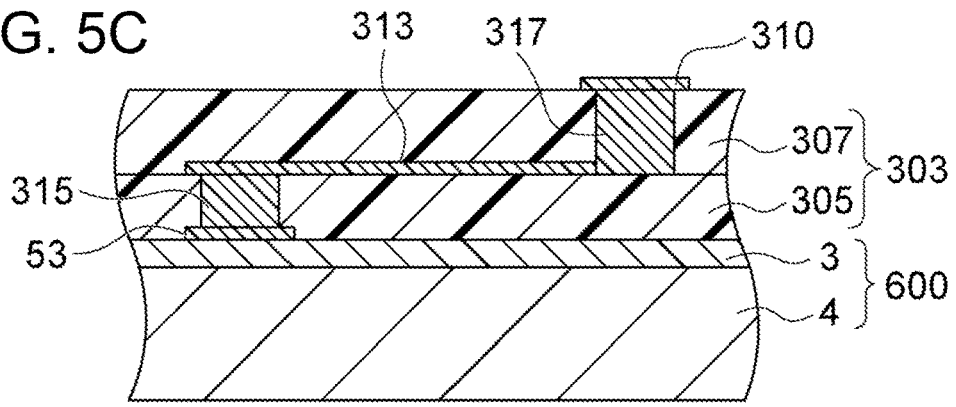
FIG. 5C is a cross-sectional view showing a portion of a modification of the SAW filter in FIG. 5A.

FIG. 5B is an upper surface view of the SAW filter 301. In this view, the notation of the terminal 53 corresponding to the land 310 is attached to the land 310.

As shown in FIG. 5A and FIG. 5B, on the upper surface of the cover 303, reinforcing layers 311 (311A, 311B) are provided which overlap at least a portion of the vibration space S when viewed on a plane. The reinforcing layers 311 are for example configured by metal or other conductors having a higher rigidity than the cover 303. The reinforcing layers 311 for example contribute to suppression of warping of the lid 307 to the vibration space S side.

The reinforcing layers 311 may be connected or may not be connected to the lands 310. From another viewpoint, they may be electrically connected or may not be connected with the terminals 53 in the SAW filter 51. In the example in FIG. 5B, the reinforcing layers 311 are connected to the lands 310 corresponding to the GND terminals 53G.

The reinforcing layer 311A and the reinforcing layer 311B are separated from each other. The reinforcing layer 311A is connected to the GND terminals 53G-2 and 53G-3. The reinforcing layer 311B is connected to the GND terminal 53G-1. Accordingly, the GND terminal 53G-1 connected to the additional resonator 57 is electrically separated from the parallel resonator 67 and the GND terminal 53G-2 which is connected to the parallel resonator 67 in the SAW filter 301 as a whole as well. Note that, the reinforcing layer 311A and the reinforcing layer 311B need not be separated, and the GND terminal 53G-1 and the GND terminal 53G-2 may be short-circuited.

From another viewpoint, the SAW filter 301 has a relatively broad conductor layer (reinforcing layer 311B) which is short-circuited with the GND terminal 53G-1. This conductor layer for example can contribute to heat dissipation of the GND terminal 53G-1. The size of the reinforcing layer 311B is for example broader than the IDT electrode 7 in the additional resonator 57. Note that, sometimes the boundary between the edge part of the bus bar 13 on the outside and the wiring 59 is not clear. Further, the size of the bus bar 13 may be any size in theory. Accordingly, as the area of the IDT electrode 7 which is compared with the area of the reinforcing layer 311B, use may be made of the area of the region where the plurality of electrode fingers 15 are arranged (region between the pair of bus bars 13).

FIG. 5C is a cross-sectional view for explaining a modification of the package of the SAW filter 301.

As shown in this view, in the cover 303 (for example between the frame 305 and the lid 307), a layered conductor pattern 313 parallel to the piezoelectric substrate 3 may be provided as well. The conductor pattern 313 may configure an inductor or capacitor or another electronic element by being given a suitable planar shape. When the electronic element is configured by the conductor pattern 313, this electronic element may be interposed between the terminal 53 and the land 310 as well. In the example shown, the conductor pattern 313 is interposed between a via conductor 315 which is positioned on the terminal 53 and penetrates through the frame 305 and a via conductor 317 which penetrates through the lid 307 and is connected to the land 310.

Note that, when considering the heat dissipation efficiency, for the GND terminal 53G connected to the additional resonator 57, the route up to an electrical connection with the conductor pattern having a broad area may be made as short as possible as well. For example, this may be connected to the layered conductor pattern having a broad area by only the via conductor 309 or 315. Further, the GND terminal 53G connected with the parallel resonator 67 may be led out to the land 310 through the inductor etc. in the cover 303, while the GND terminal 53G which is connected to the additional resonator 57 may be led out to the land 310 without passing through a conductor pattern having a narrow line width and being tortuous in the surface in the cover 303.

(Bonded Substrate)

As already explained or as shown in FIG. 5C, the substrate 600 is not limited to a single piezoelectric substrate 3 and may be one formed by bonding the support substrate 4 to the lower surface of the piezoelectric substrate 3.

The support substrate 4 is configured by a material provided with a strength strong enough to support the piezoelectric substrate 3. For example, the support substrate 4 is formed by a material having a smaller coefficient of linear thermal expansion than that of the material for the piezoelectric substrate 3 (if either has anisotropy, for example, the coefficient of linear thermal expansion in the D1 axis direction). As such a material, for example, there can be mentioned silicon or another semiconductor, sapphire or another single crystal, and an aluminum oxide sintered body or other ceramic. Note that, the support substrate 4 may be configured by laminating a plurality of layers which are formed by materials different from each other. Further, an intermediate layer (bonding layer) may be interposed between the support substrate 4 and the piezoelectric substrate 3 as well. The intermediate layer may be a laminate formed by laminating a plurality of layers.

The shape of the support substrate 4 is for example a substantially thin rectangular cuboid shaped. Further, when viewed on a plane, for example, it has a shape and dimensions matching those of the piezoelectric substrate 3. The thickness of the support substrate 4 is for example constant and greater than the thickness of the piezoelectric substrate 3. The specific value of the thickness of the support substrate 4 may be suitably set. As an example, in contrast to the thickness of the piezoelectric substrate 3 being 10 μm to 30 μm, the thickness of the support substrate 4 is 100 μm to 300 μm. Further, for example, the thickness of the support substrate 4 is 5 times to 20 times the thickness of the piezoelectric substrate 3

The piezoelectric substrate 3 and the support substrate 4 are for example bonded to each other through a not shown bonding layer. The materials for the bonding layer may be organic material or inorganic material. As the organic material, for example, there can be mentioned thermosetting resin or another resin. As the inorganic material, for example, there can be mentioned SiO$_2$. Further, the piezoelectric substrate 3 and the support substrate 4 may be bonded by so-called direct bonding of activating the bonding surfaces by plasma or the like, then bonding the two to each other without a bonding layer.

By providing the support substrate 4, for example, the change of the frequency characteristic of the SAW resonator 1 caused by thermal expansion of the piezoelectric substrate 3 can be compensated for.

Note that, in the present disclosure, the support substrate 4 is shown only in the example in FIG. 5C. However, the support substrate 4 may be provided in the other examples as well. Conversely, in the example in FIG. 5C, a piezoelectric substrate 3 to which the support substrate 4 is not bonded may be used as well.

Further, the shape of the support substrate 4 may be made larger than that of the piezoelectric substrate 3 when viewed on a plane. That is, the piezoelectric substrate 3 may be positioned on the inner side from the periphery of the support substrate 4 as well. In other words, the upper surface of the support substrate 4 may have an exposed portion which is not covered by the piezoelectric substrate 3. Further, in such an exposed portion, parts of the terminals 53 and wirings 59 may be positioned. In this case, the terminals 53 can radiate heat to the side of the support substrate 4 having a better thermal conductivity than the piezoelectric substrate 3. Therefore, the electric power resistance can be further raised. In this case, the cover 303 as shown in FIG. 5A may be bonded not to the top of the piezoelectric substrate 3, but to the exposed portion in the support substrate 4.

Note that, when an intermediate layer (bonding layer) is interposed between the support substrate 4 and the piezoelectric substrate 3, the intermediate layer may be present or may not be present in the exposed portion. When considering the heat dissipation, preferably the exposed portion is not covered even by the intermediate layer.

(Coating of Additional Resonator)

The additional resonator 57 may be covered by an insulator or the like which does not cover the transmission filter 55 (its resonators) as well. In this case, for example, the propagation of the SAW (vibration of the piezoelectric substrate 3) in (the resonators of) the transmission filter 55 is permitted, while the propagation of the SAW in the additional resonator 57 can be suppressed. In the following description, an example of such an insulator will be shown.

Figure 6A:
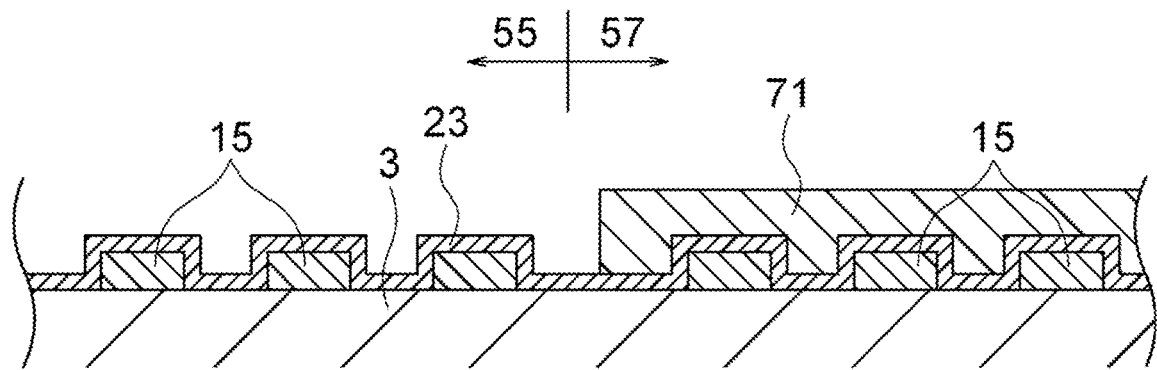
FIG. 6A, FIG. 6B, and FIG. 6C are views respectively showing examples of an insulator covering the additional resonator.

FIG. 6A is a cross-sectional view schematically showing a portion of an example of the configuration in the upper surface of the piezoelectric substrate 3.

The upper surface of the piezoelectric substrate 3 is covered by the protective film 23 from the tops of the conductor layers configuring the IDT electrode 7 etc. The protective film 23 may be one for simply suppressing corrosion of the IDT electrode 7 etc. or may be one contributing to temperature compensation. The protective film 23 is for example made of SiO$_2$. Further, the thickness thereof may be thinner than the IDT electrode 7 etc. (example shown) or may be thicker than the latter. The protective film 23 for example covers both of the transmission filter 55 and additional resonator 57.

The additional resonator 57 is covered by an insulation layer 71 which is not provided on the transmission filter 55 (serial resonators 65 and parallel resonators 67). The insulation layer 71 is for example configured by a resin or inorganic material. The thickness thereof may be suitably set. Note that, the insulation layer 71 may also directly cover the additional resonator 57 without having the protective film 23 interposed therebetween.

Figure 6B:
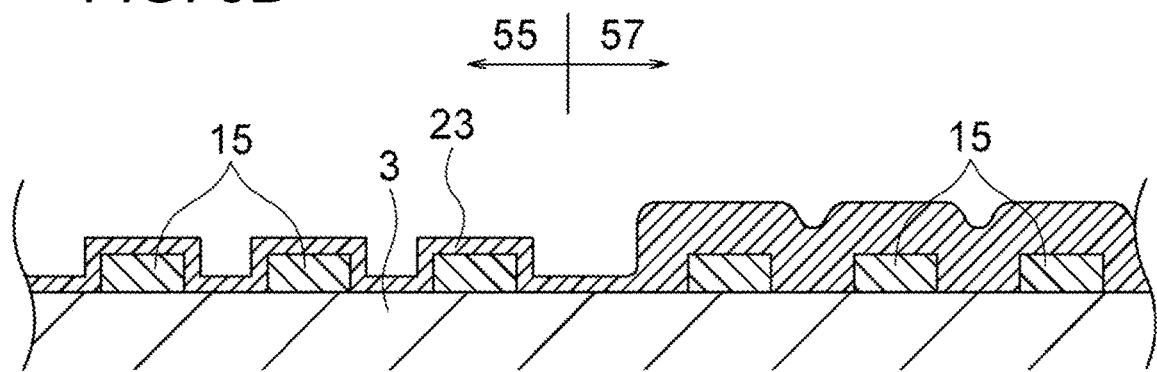

FIG. 6B is a cross-sectional view schematically showing a portion of another example of the configuration on the upper surface of the piezoelectric substrate 3.

In this example, in the protective film 23 explained with reference to FIG. 6A, the thickness on the additional resonator 57 becomes greater than the thickness on the transmission filter 55 (serial resonators 65 and parallel resonators 67). Such a configuration is for example realized by performing a process of forming a film of a material for forming the protective film 23 on the entire surface of the piezoelectric substrate 3 and a process of forming a film of a material for forming the protective film 23 only on the additional resonator 57. Note that, either of the above two processes may be first.

Figure 6C:
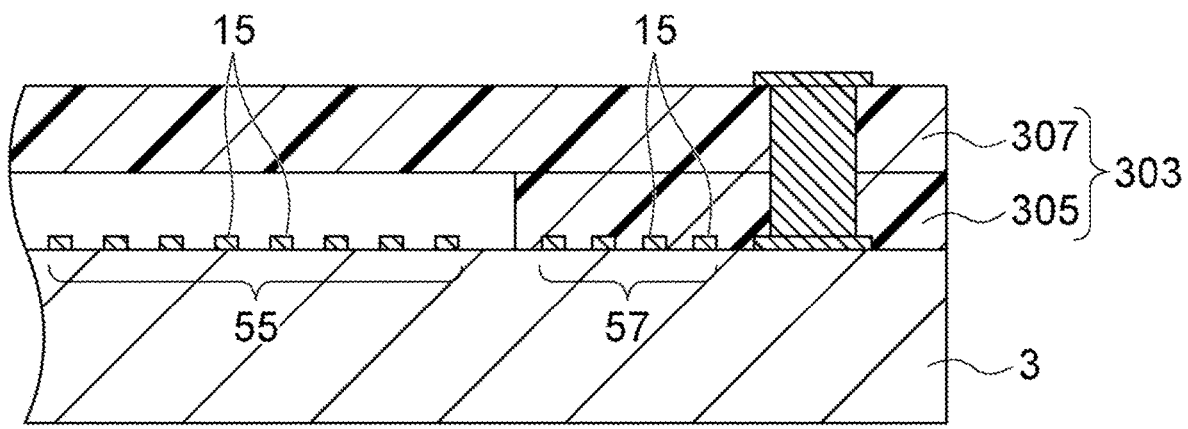

FIG. 6C is a cross-sectional view schematically showing a portion of still another example of the configuration of the upper surface of the piezoelectric substrate 3.

In this example, provision of the cover 303 explained with reference to FIG. 5A is assumed. Further, a frame 305 in the cover 303, when viewed on a plane, surrounds the transmission filter 55 and is positioned on the additional resonator 57. That is, the frame 305 functions as an insulator covering only the additional resonator 57 between the transmission filter 55 (its resonators) and the additional resonator 57. Note that, the protective film 23 is not shown in FIG. 6C, but the cover 303 may be provided on the protective film 23 as well.

(Example of Utilization of Additional Resonator)

Figure 7:
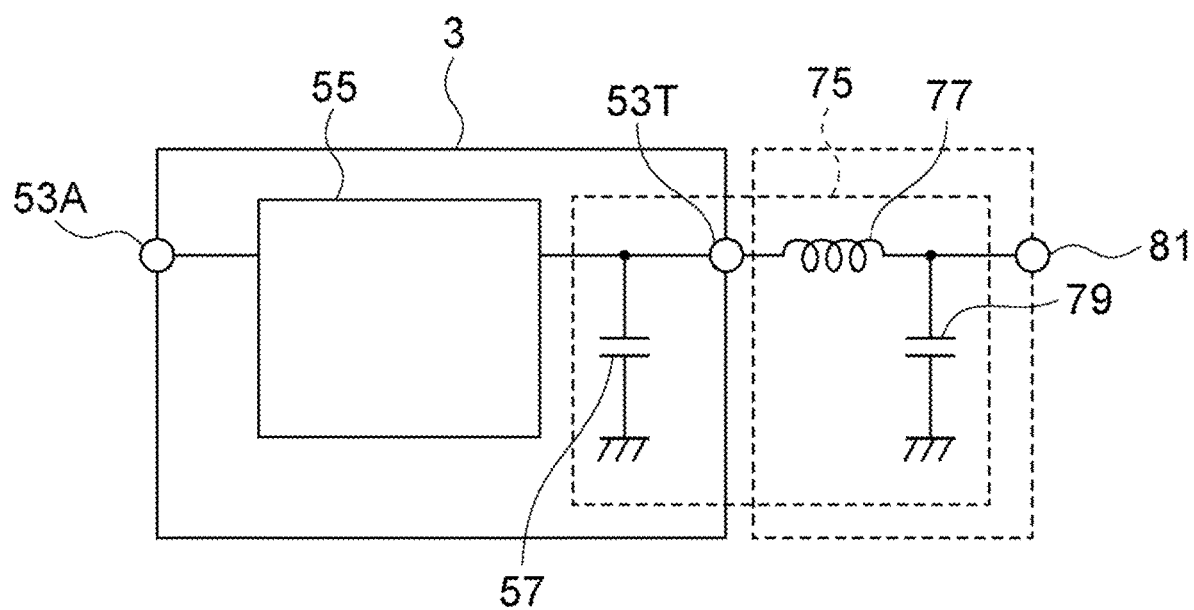
FIG. 7 is a schematic circuit diagram showing an example of utilization from an electrical viewpoint of the additional resonator.

FIG. 7 is a schematic circuit diagram showing an example of utilization from an electrical viewpoint of the additional resonator 57.

In this example, the additional resonator 57 is utilized for configuring a low pass filter 75 connected at a stage before (input side) the transmission filter 55. The low pass filter 75 is for example a π-type. That is, the low pass filter 75 has an inductor 77 and two capacitors (here, capacitor 79 and additional resonator 57) connected in a π-shape.

The inductor 77 is arranged in series with respect to the signal route. That is, the inductor 77 connects an input port 81 connected with a circuit generating a transmission signal and the transmission terminal 53T in the SAW filter 51. The capacitor 79 connects the front (input side) of the inductor 77 and the reference potential portion. The additional resonator 57 connects the back (output side) of the inductor 77 and the reference potential portion. That is, the additional resonator 57 functions as the capacitor on the side closest to the transmission filter 55 in the π-type low pass filter. Note that, the π-type low pass filter may have one or more combinations of the inductor 77 and capacitor 79 on the further input side of the inductor 77 and capacitor 79 which are shown as well.

The inductance of the inductor 77 and the capacities of the capacitor 79 and additional resonator 57 may be suitably set according to a known design method. Usually, in a low pass filter having one inductor and two capacitors as shown in the figure, the capacities of the two capacitors are made equal. In the low pass filter 75, the capacitance of the additional resonator 57 may be equal to or different from the capacitance of the capacitor 79. For example, it is smaller than the capacitance of the capacitor 79. Even in a case where two or more combinations of the inductor 77 and capacitor 79 are provided, in the same way, the capacitance of the additional resonator 57 may be equal to the capacitance of any of the capacitors 79 or may be different from the capacitance of any of the capacitors 79. For example, it is smaller than the capacitance of any of the capacitors 79.

The inductor 77 and capacitor 79 may be suitably configured from a structural viewpoint.

For example, the electronic element in at least one of the inductor 77 and capacitor 79 may be provided in a not shown circuit board on which the SAW filter 51, 201, or 301 is mounted. In this case, the electronic element (77 and/or 79) may be configured by for example a conductor on the surface or in the internal portion of the circuit board or may be configured by components mounted on the circuit board.

Further, for example, the electronic element of at least one of the inductor 77 and capacitor 79 may be provided on the surface or in the internal portion of the package-use member of the SAW filter 201 or 301. For example, the electronic element (77 and/or 79) may be configured by a conductor pattern 213 on the surface or in the internal portion of the facing substrate 203 in the SAW filter 201, may be configured by the electronic component 217 in the SAW filter 201, or may be configured by the conductor pattern 313 in the SAW filter 301.

Further, unlike the example shown, at least one of the inductor 77 and capacitor 79 may be configured by a conductor pattern on the piezoelectric substrate 3 as well. From another viewpoint, the electronic element (77 and/or 79) may be connected between the transmission terminal 53T and the transmission filter 55 in the SAW filter 51 as well. In this case, the conductor layer configuring the electronic element (77 and/or 79) may be the same as the conductor layer configuring the IDT electrode 7 etc. (materials and thicknesses are the same), or may be different from the latter.

(Multiplexer (Duplexer))

Figure 8:
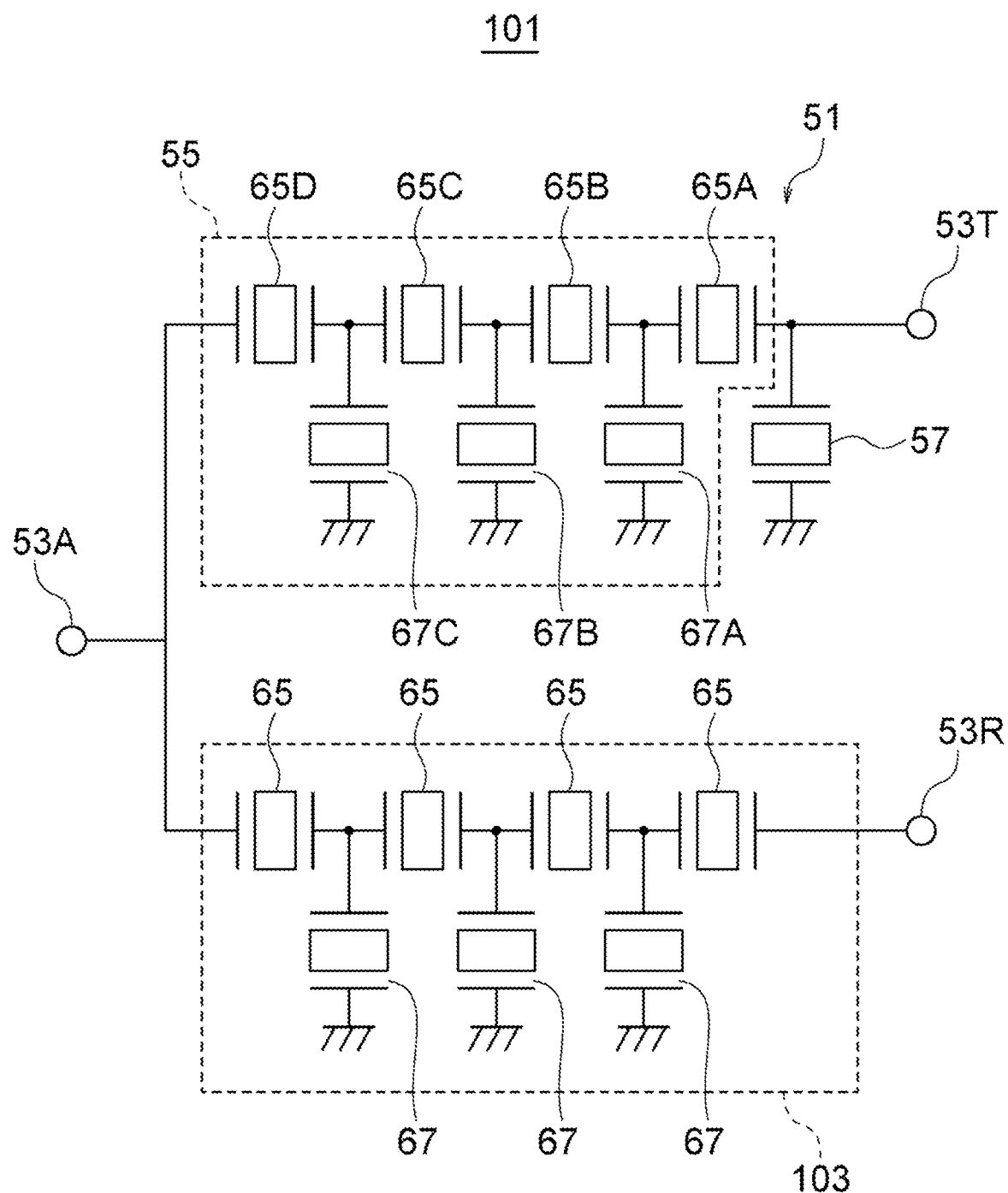
FIG. 8 is a view schematically showing a multiplexer as an example of utilization of the SAW filter in FIG. 2.

FIG. 8 is a view schematically showing a multiplexer 101 as an example of utilization of the SAW filter 51.

The multiplexer 101 is for example a duplexer branching a transmission signal and a reception signal. In this branching, use is made of the SAW filter 51 as a filter filtering a transmission signal.

The multiplexer 101 for example has a SAW filter 51, a receiving filter 103, and a reception terminal 53R. The receiving filter 103 is connected to the antenna terminal 53A and the reception terminal 53R, filters the signal from the antenna terminal 53A, and outputs the result to the reception terminal 53R.

The configuration of the receiving filter 103 may be suitable one. In FIG. 8, as the receiving filter 103, in the same way as the transmission filter 55, one configured by a ladder-type SAW filter is exemplified. Note that, the SAW filter configuring the receiving filter 103 may be another type (for example a multimode type filter) as well.

When the receiving filter 103 is configured by the SAW filter in this way, the SAW filter 51 and the receiving filter 103 may be provided on the same piezoelectric substrate 3 or may be provided on piezoelectric substrates 3 which are different from each other. Note that, when they are provided on the same piezoelectric substrate 3, for example, the antenna terminal 53A is one common to the transmission filter 55 and the receiving filter 103, and the receiving filter 103 is connected to the antenna terminal 53A on the piezoelectric substrate 3. When they are provided on piezoelectric substrates 3 which are different from each other, the antenna terminal 53A is for example one used only for the transmission filter 55 between the transmission filter 55 and the receiving filter 103, so is not positioned on the shortest route between the antenna and the receiving filter 103. However, the antenna terminal 53 and the receiving filter 103 are still connected as they are through the circuit board on which the SAW filter 51 and the receiving filter 103 are mounted or the like.

Although not particularly shown, the multiplexer 101 may have a configuration other than that described above. For example, a low pass filter which is positioned between the antenna terminal 53A and the antenna and is not positioned on the shortest route between the receiving filter 103 and the antenna may be provided or a low pass filter which is positioned on the antenna side with respect to the receiving filter 103 and is not positioned on the shortest route between the transmission filter 55 and the antenna may be provided.

(Communication Apparatus)

Figure 9:
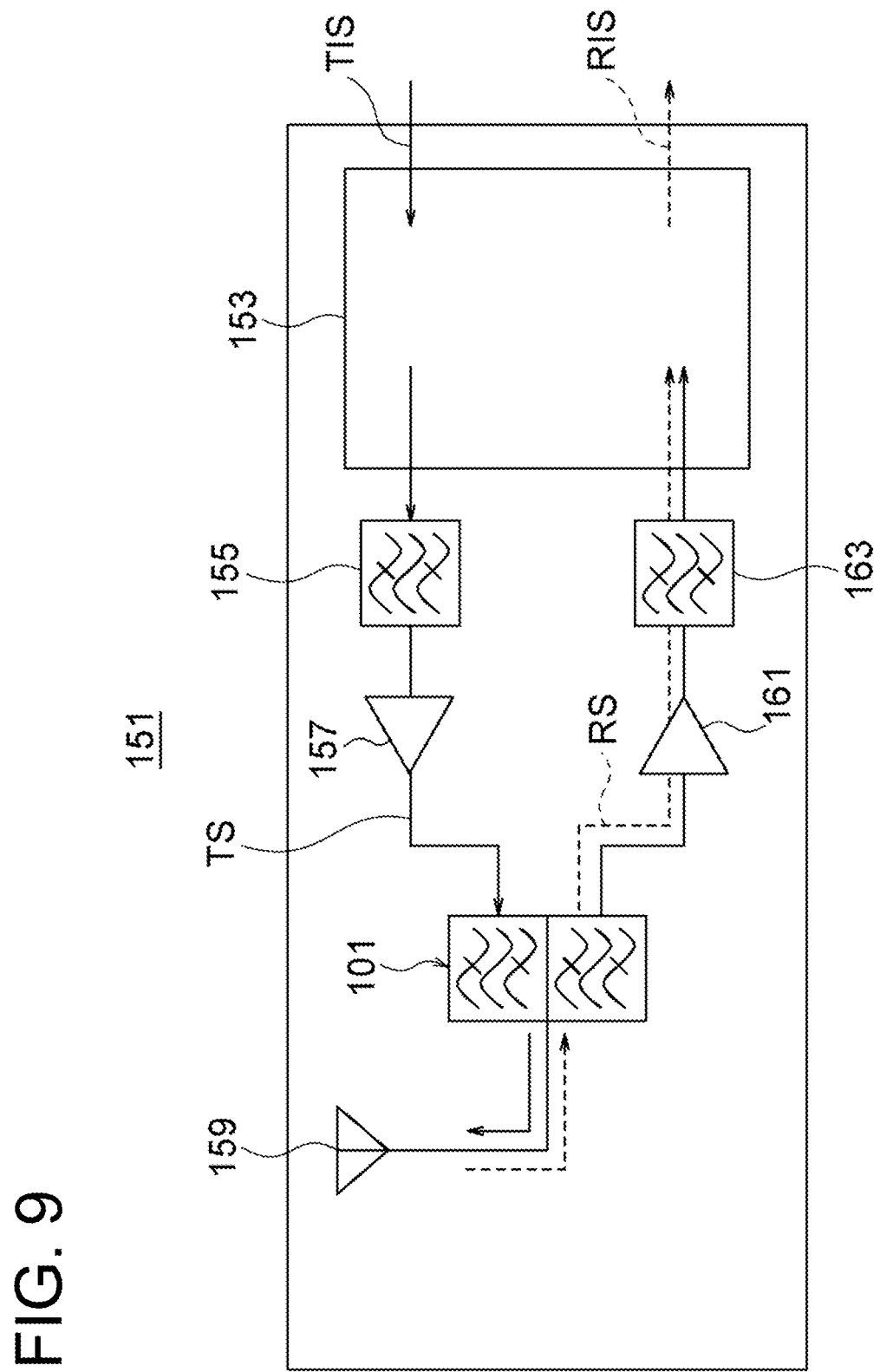
FIG. 9 is a block diagram showing the configuration of principal parts of a communication apparatus as an example of utilization of the multiplexer in FIG. 8.

FIG. 9 is a block diagram showing the configuration of principal parts of a communication apparatus 151 as an example of utilization of the multiplexer 101.

In the communication apparatus 151, a transmission information signal TIS including the information to be transmitted is modulated and raised in frequency (conversion to a high frequency signal having a carrier frequency) by the RF-IC (radio frequency integrated circuit) 153 to form a transmission signal TS. The transmission signal TS is stripped of unwanted components out of the transmission-use passing band by a bandpass filter 155, amplified by an amplifier 157, and input to the multiplexer 101 (transmission terminal 53T). Further, the multiplexer 101 strips the unwanted components out of the transmission-use passing band from the input transmission signal TS and outputs the stripped transmission signal TS from the antenna terminal 53A to an antenna 159. The antenna 159 converts the input electrical signal (transmission signal TS) to a wireless signal (radio wave) and transmits the result.

Further, in the communication apparatus 151, the wireless signal (radio wave) received by the antenna 159 is converted to an electrical signal (reception signal RS) by the antenna 159 and is input to the multiplexer 101 (for example, antenna terminal 53A). The multiplexer 101 strips the unwanted components out of the reception-use passing band from the input reception signal RS and outputs the result from the reception terminal 53R to an amplifier 161. The output reception signal RS is amplified by the amplifier 161 and is stripped of the unwanted components out of the reception-use passing band by a bandpass filter 163. Further, the reception signal RS is lowered in frequency and demodulated by the RF-IC 153 to thereby form a reception information signal RIS.

Note that, the transmission information signal TIS and reception information signal RIS may be low frequency signals (baseband signals) including suitable information. For example, they are analog audio signals or digitalized audio signals. The passing band of the wireless signal may be one according to UMTS (universal mobile telecommunications system) or other various standards. The modulation system may be phase modulation, amplitude modulation, frequency modulation, or any combination of two or more among them. As the circuit system, a direct conversion system was exemplified in FIG. 9. However, a suitable system other than that may be employed. For example, it may be a double super heterodyne system as well. Further, FIG. 9 schematically shows only the principal parts. A low pass filter or isolator etc. may be added to a suitable position. Further, the position of the amplifier or the like may be changed as well.

Although not particularly shown, it is also possible to configure a multiplexer (duplexer etc.) by connection of two or more SAW filters 51 which are different in passbands from each other to a common antenna-use port (may be antenna terminal 53A) or connection of two or more multiplexers 101 which are different in passbands from each other to a common antenna-use port. Further, a communication module may be configured by mounting suitable electronic components on a circuit board on which the SAW filter 51, 201, or 301 is mounted.

As described above, in the present embodiment, the SAW filter 51 (or 201 or 301) has the piezoelectric substrate 3, transmission terminal 53T, antenna terminal 53A, one or more GND terminals 53G, transmission filter 55, and additional resonator 57. Various types of terminals 53 are positioned on the piezoelectric substrate 3. The transmission filter 55 is a ladder-type filter filtering signals from the transmission terminal 53T and outputting the result to the antenna terminal 53A. Further, the transmission filter 55 has one or more serial resonators 65 and one or more parallel resonators 67 which are connected in a ladder configuration on the piezoelectric substrate 3, and the initial stage resonator is the serial resonator 65. The additional resonator 57 includes an IDT electrode 7 on the piezoelectric substrate 3. The IDT electrode is connected to the transmission terminal 53T at a stage before the transmission filter 55 and is connected to any of the one or more GND terminals 53G. In the additional resonator 57, the resonance frequency and antiresonance frequency are positioned outside of the passband of the transmission filter 55.

Accordingly, for example, by the additional resonator 57, a heat dissipation route enabling escape of heat on the side of a stage before the transmission filter 55 is configured. When the initial stage resonator is the serial resonator 65, the thermal load and electrical load tend to concentrate at this initial stage serial resonator 65. In such a configuration, the heat dissipation route is connected to a stage before the initial stage serial resonator 65. Therefore, for example, the maximum value of the thermal load of the SAW filter 51 as a whole can be lowered and consequently the durability of the SAW filter 51 as a whole can be improved. Further, for example, the influence of heat exerted upon the filter characteristic can be mitigated.

Further, the heat dissipation route is configured by the resonator (57). Therefore, for example, it becomes possible to utilize this additional resonator 57 for a low pass filter and the like. That is, the configuration for improving the filter characteristic in the SAW filter 51 can be used also for the heat dissipation route, therefore the size of the SAW filter 51 or a device including the SAW filter 51 is reduced.

Note that, in the above explanation, the resonance frequency and antiresonance frequency of the additional resonator 57 were positioned outside of the passband of the transmission filter 55. However, it is only necessary that no resonance occurs in the passband of the transmission filter 55. For example, the electrode fingers 15 in the additional resonator 57 may be arranged in the direction perpendicular to the direction of propagation of SAW, and the pitch of the electrode fingers 15 does not be matter.

Here, the transmission signal which is input from the outside to the transmission terminal 53T is basically generated as a signal in the passband of the transmission filter 55. On the other hand, the resonance frequency and antiresonance frequency of the additional resonator 57 are positioned outside of the passband of the transmission filter 55. Accordingly, the vibration in the additional resonator 57 is suppressed compared with that in the transmission filter 55. As a result, for example, the additional resonator 57 effectively functions as a heat dissipation route and has a high electric power resistance as well.

Further, for example, the additional resonator 57 is formed on the piezoelectric substrate 3, therefore can be formed simultaneously with the formation of the transmission filter 55. Accordingly, the probability of the manufacturing steps increasing due to the provision of the additional resonator 57 can be reduced.

Further, in the present embodiment, the GND terminal 53G-1 connected with the additional resonator 57 is not a GND terminal 53G which is connected through any of the parallel resonators 67 with the serial arm 61 (from another viewpoint, the transmission terminal 53T and antenna terminal 53A) and is not short-circuited with any such GND terminals 53G (electrically separated).

Accordingly, for example, the probability of heat at a stage before the initial stage serial resonator 65 returning through the additional resonator 57 back to the transmission filter 55 is reduced.

Further, in the present embodiment, the electrostatic capacitance of the additional resonator 57 is different from the electrostatic capacitances of all of the parallel resonators 67.

The additional resonator 57 does not configure part of the transmission filter 55, therefore can be set to such an electrostatic capacitance. By configuring the additional resonator 57 so that the electrostatic capacitance of the additional resonator 57 is different from the electrostatic capacitances of the parallel resonators 67, various effects are obtained. When the electrostatic capacitance of the additional resonator 57 is larger than the electrostatic capacitances of the parallel resonators 67, it is easy to make the electrode fingers 15 longer or make the number of the electrode fingers 15 larger. That is, the electrode area of the additional resonator 57 is easily enlarged. As a result, for example, the heat dissipation function of the additional resonator 57 itself is improved. Further, for example, when the electrostatic capacitance of the additional resonator 57 is larger than the electrostatic capacitances of the parallel resonators 67, it is easy to make the electrode finger pitch of the additional resonator 57 narrower. By the electrode finger pitch being narrower, for example, it becomes easy to transfer heat between the pair of comb-shaped electrodes 11, therefore the additional resonator 57 effectively functions as a heat dissipation route. Further, by the electrode finger pitch being narrower, for example, the electrode area occupied in the area of the entirety of the additional resonator 57 (area including also the region where no electrode is arranged) can be made larger. Conversely to the above description, when the electrostatic capacitance of the additional resonator 57 is smaller than the electrostatic capacitances of the parallel resonators 67, for example, it is easy to reduce the size of the additional resonator 57 and consequently reduce the size of the SAW filter 51.

Further, in the present embodiment, the additional resonator 57 configures a capacitor on the side closest to the transmission filter 55 in the π-shaped low pass filter 75 which is connected to a stage before the transmission filter 55.

Accordingly, for example, as explained above, the additional resonator 57 configuring the heat dissipation route is effectively utilized. Further, the additional resonator 57 is configured including an IDT electrode 7. Therefore, for example, the capacitance can be easily finely adjusted by changing the number of the electrode fingers 15. That is, the characteristics of the low pass filter 75 can be more easily and conveniently adjusted than a case where a capacitor is provided outside of the SAW filter 51.

Further, in the present embodiment, the electrostatic capacitance of the additional resonator 57 is different from the electrostatic capacitance of any of the one or more capacitors (here, capacitor 79) other than the additional resonator 57 included in the low pass filter 75. Note that, "the capacitance of the additional resonator 57 is different from the capacitance of the other capacitors" referred to here means for example a state where the difference of capacitances is not less than an amount of increase or decrease of the capacitance caused by increasing or decreasing one electrode finger 15 in the additional resonator 57.

As described above, the capacitance of the additional resonator 57 is easily adjusted, therefore such an electrostatic capacitance is easy to set as well. Note that, usually the electrostatic capacitance of the capacitor (additional resonator 57 in the present embodiment) which is positioned at the rearmost stage of the π-shaped low pass filter 75 is made equal to the electrostatic capacitance of any other capacitor 79.

Further, in the present embodiment, the electrostatic capacitance of the additional resonator 57 is smaller than the electrostatic capacitance of any capacitor 79 in the low pass filter 75.

Accordingly, for example, it is easy to reduce the size of the additional resonator 57 and consequently easy to reduce the size of the SAW filter 51.

Further, in the present embodiment, the SAW filter 301 (FIG. 5) has a conductor layer (reinforcing layer 311B). The reinforcing layer 311B is short-circuited with the GND terminal 53G-1 connected with the additional resonator 57 and has a broader area than the region where the pluralities of electrode fingers 15 are arranged in the IDT electrode 7 in the additional resonator 57.

Accordingly, for example, the heat escaping from a stage before the transmission filter 55 to the additional resonator 57 can be transferred to the reinforcing layer 311B. The reinforcing layer 311B has a relatively broad area. Therefore, for example, it is advantageous for transfer of heat to other members in contact with the reinforcing layer 311B or for heat dissipation from the reinforcing layer 311B. Further, the potential of the additional resonator 57 becomes easy to be stabilized, therefore noise can be reduced.

Further, in the present embodiment, the SAW filter 51, 201, or 301 has an insulator (insulation layer 71 (FIG. 6A)), the protective film 23 (FIG. 6B) or frame 305 (FIG. 6C) each cover only the additional resonator 57 among the serial resonators 65, parallel resonators 67, and additional resonator 57 or become thicker only on the additional resonator 57 among the serial resonators 65, parallel resonators 67, and additional resonator 57.

Accordingly, for example, vibration in the additional resonator 57 is suppressed compared with vibration in the transmission filter 55. As a result, for example, the probability of vibration of the additional resonator 57 influencing the filter characteristic of the transmission filter 55 is reduced.

Further, in the present embodiment, the passband PB of the transmission filter 55 is for example positioned in a frequency range not more than 2.7 GHz.

In this case, for example, compared with the case where part or all of the passband PB exceeds 2.7 GHz, the electrode finger pitch in the transmission filter 55 is broader. Accordingly, for example, it is easy to make the electrode finger pitch in the additional resonator 57 smaller to reduce the size of the additional resonator 57 while securing the electrostatic capacitance and make the resonance frequency and antiresonance frequency of the additional resonator 57 separate from the passband PB.

Further, in the present embodiment, the SAW filter 201 or 301 has a package-use member (facing substrate 203 or cover 303) for sealing the transmission filter 55. At least one of the inductors 77 and capacitors (capacitor 79) other than the additional resonator 57 which are included in the low pass filter 75 is for example configured by a conductor pattern 213 or 313 which is positioned in at least the internal portion or at the surface of the package-use member.

In this case, for example, compared with the case where the inductor 77 and capacitor 79 are provided outside of the SAW filter, the additional resonator 57 is effectively utilized by the SAW filter itself, therefore the characteristics of the SAW filter itself can be improved. Further, compared with the case where the inductor 77 and/or capacitor 79 is configured on the piezoelectric substrate 3, for example, the probability of unwanted vibration being generated in the piezoelectric substrate 3 is reduced, and it is easy to make the area of the piezoelectric substrate 3 smaller and make the conductor patterns configuring the inductor 77 and capacitor 79 thicker.

Further, at least one of the inductors 77 and capacitors (capacitor 79) other than the additional resonator 57 which are included in the low pass filter 75 may be configured by for example an electronic component 217 mounted on the package-use member (facing substrate 230) as well.

In this case, for example, the same effects as those in the case of configuring the inductor 77 and/or capacitor 79 by the conductor pattern 213 or 313 are obtained. For example, the additional resonator 57 is effectively utilized by the SAW filter itself, and the characteristics of the SAW filter itself can be improved.

Further, in the present embodiment, there are two or more serial resonators 65. At least one of the plurality of serial resonators 65 is divided into a plurality of divided resonators 69 which are connected in series with each other. Among the plurality of serial resonators 65, the number of division of the serial resonator 65 on the side closest to the transmission terminal 53T (initial stage resonator) is larger than the number of division of the serial resonator on the side closest to the antenna terminal 53A.

Accordingly, the electric power resistance of the initial stage serial resonator 65 at which thermal and electrical loads tend to concentrate is improved, whereby the electric power resistance of the SAW filter 51 as a whole can be improved. Note that, in the SAW filter 51, when judging which of the two types of terminals 53 is the transmission terminal 53T or the antenna terminal 53A, the side where the number of division of the serial resonators 65 is larger may be judged as the transmission terminal 53T side.

Note that, in the above embodiment, each of the SAW filters 51, 201, and 301 is one example of the acoustic wave filter. The GND terminal 53G is one example of the reference potential terminal. The reinforcing layer 311B is one example of the conductor layer. Each of the insulation layer 71, the protective film 23 (one in FIG. 6B)), and the frame 305 (one in FIG. 6C) is one example of the insulator. Each of the facing substrate 203 and cover 303 (frame 305) is one example of the package-use member.

(Modification of Multiplexer)

Figure 10:
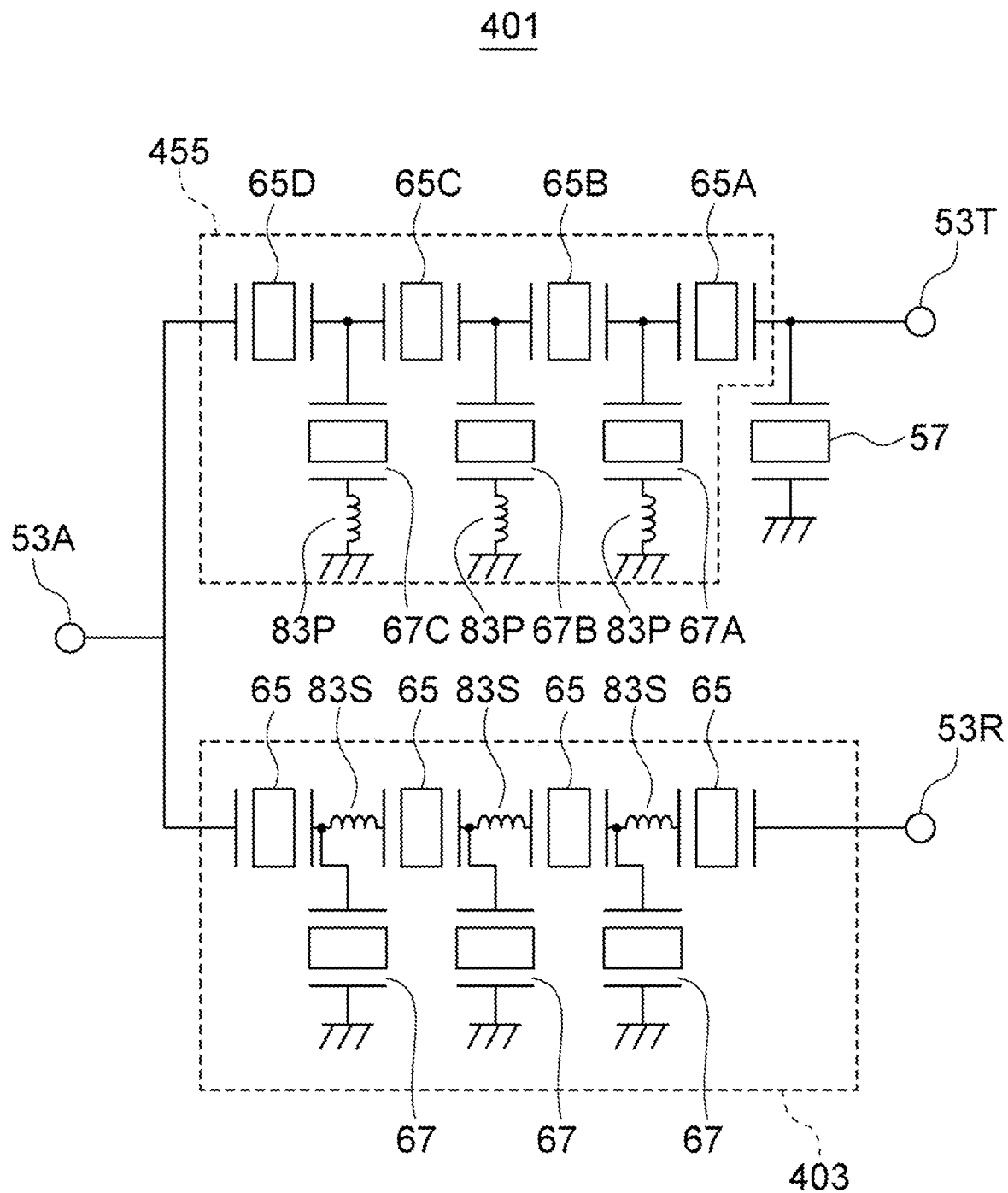
FIG. 10 is a view schematically showing a modification of the multiplexer in FIG. 8.

FIG. 10 is a schematic view showing the configuration of a multiplexer 401 (duplexer) according to a modification.

The multiplexer 401 differs from the multiplexer 101 in FIG. 8 only on the point that one or more parallel inductors 83P and one or more serial inductors 83S (below, sometimes the two will not be differentiated and will be simply referred to as the "inductors 83") are provided. However, along with the provision of the inductors 83, the specific design values of the serial resonators 65 and parallel resonators 67 may be suitably adjusted.

Each parallel inductor 83P is connected in series to a parallel resonator 67 in a transmission filter 455. More specifically, for example, the parallel inductor 83P is connected to the parallel resonator 67 at the reference potential portion (GND terminal 53G) side. Note that, the parallel inductor 83P may be connected to the parallel resonator 67 at the serial arm side unlike the example shown.

Further, parallel inductors 83P, for example, are individually provided for all of the parallel resonators 67 (one-to-one) in the transmission filter 455. However, the parallel inductors 83P may be provided for only part of the plurality of parallel resonators 67 as well. Further, one parallel inductor 83P may be commonly connected to two or more parallel resonators 67.

Each serial inductor 83S is connected in series to a serial resonator 65 in a receiving filter 403. More specifically, for example, the serial inductor 83S is positioned between two serial resonators 65 which are adjacent to each other about the electrical connection. Note that, between the two serial resonators 65, the serial inductor 83S may be positioned on the reception terminal 53R side (example shown) or may be positioned on the antenna terminal 53A side relative to the connection position of the serial arm and the parallel resonator 67.

Further, a serial inductor 83S, for example, is provided between each two of all of the plurality of serial resonators 65 in the receiving filter 403. However, serial inductors 83S may be provided for only part of the plurality of serial resonators 65 as well. Further, serial inductors 83S may also be provided outside of the plurality of serial resonators 65 (between the transmission terminal 53T and the first serial resonator 65A and between the fourth serial resonator 65D and the antenna terminal 53A) as well.

The frequency characteristic of a combination of a SAW resonator 1 (65 or 67) and an inductor 83 which are connected in series to each other substantially becomes the frequency characteristic of the SAW resonator 1 in which the antiresonance frequency is maintained as it is while the resonance frequency is moved to a lower frequency side.

For example, assume that the frequency characteristic of the parallel resonator 67 is represented by the line L2 in FIG. 3. In this case, the frequency characteristic of the combination of the parallel resonator 67 and the parallel inductor 83P becomes a characteristic in which the antiresonance frequency fpa is maintained as it is, but the resonance frequency fpr is shifted to a lower frequency side (left side on the drawing sheet). From another viewpoint, the frequency difference Δf between the resonance frequency fpr and the antiresonance frequency fpa becomes larger.

In the same way, for example, the frequency characteristic of a serial resonator 65 is represented by the line L1 in FIG. 3. In this case, the frequency characteristics of the combination of the serial resonator 65 and the serial inductor 83S becomes a characteristic in which the antiresonance frequency fsa is maintained as it is, but the resonance frequency fsr is shifted to a lower frequency side. From another viewpoint, the frequency difference Δf between the resonance frequency fsr and the antiresonance frequency fsa becomes larger.

Further, in each of the transmission filter 455 and the receiving filter 403, in the state where the inductors 83 are connected, the serial resonators 65, parallel resonators 67, and inductors 83 are designed so that the resonance frequency fsr of the serial arm and the antiresonance frequency fpa of the parallel arm substantially coincide. Due to this, a ladder-type filter having the desired frequency band as the passband PB is obtained.

In the transmission filter 455, the frequency difference Δf of the parallel arm including the parallel resonators 67 and parallel inductors 83P becomes larger, therefore the passband PB becomes broader compared with the case where the parallel inductor 83P is not provided. That is, by providing the parallel inductors 83P, it is made easier to obtain a filter having a broad band.

On the other hand, in the transmission filter 455, the serial inductor 83S is not provided, therefore the frequency difference Δf of the serial arm is maintained narrow. As a result, for example, a steepness on a high frequency side of the passband PB is maintained. In other words, the attenuation amount out of the band on a high frequency side can be made larger.

Further, in the receiving filter 403, the frequency difference Δf of the serial arm including the serial resonators 65 and serial inductors 83S becomes larger, therefore the passband PB becomes broader compared with the case where the serial inductors 83S are not provided. That is, by providing the serial inductors 83S, it is made easier to obtain a filter having a broad band.

On the other hand, the receiving filter 403 is not provided with the parallel inductors 83P, therefore the frequency difference Δf of the parallel arm is maintained narrow. As a result, for example, the steepness on a low frequency side of the passband PB is maintained. In other words, the attenuation amount out of the band on a low frequency side can be made larger.

Here, in the multiplexer 401, the passband PB of the transmission filter 455 is lower in frequency than the passband PB of the receiving filter 403. Accordingly, even if the inductors 83 are provided, the transmission filter 455 is maintained in steepness on the passband PB side (high frequency side) of the receiving filter 403, and the receiving filter 403 is maintained in steepness on the transmission filter 445 side (low frequency side). As a result, the multiplexer 401 becomes a filter where the bandwidth of the passband PB is broad, and isolation between the transmission filter 455 and the receiving filter 403 is high.

The inductors 83 may be configured in the same way as the inductor 77 and capacitor 79 explained with reference to FIG. 7 from a structural viewpoint. The already given explanation concerning the inductor 77 from the structural viewpoint may be applied to the explanation of the inductor 83 by replacing the "inductor 77" by the "inductor 83". For example, the inductor 83 may be provided on a circuit board on which the SAW filter (455, 403) or multiplexer 401 is mounted, may be provided in the package-use member of the SAW filter or multiplexer 401, or may be configured by a conductor pattern on the piezoelectric substrate 3.

The package-use member is for example a facing substrate 203 (FIG. 4) or cover 303 (FIG. 5A to FIG. 5C) as already explained. Further, the inductor 83 may be configured by for example a conductor pattern 213 on the surface and/or in the internal portion of the facing substrate 203 or a conductor pattern 313 on the surface and/or in the internal portion of the cover 303.

When the inductor 83 is configured by a conductor pattern 213 or 313, it is easier to reduce the size of the multiplexer 401 compared with the case where the inductor 83 is configured by a chip-shaped electronic component 217 (FIG. 4). Further, compared with the case where the inductor 83 is configured by a conductor pattern on the piezoelectric substrate 3, for example, the thickness of the conductor pattern configuring the inductor 83 can be set separately from the IDT electrode 7. As a result, for example, the conductor pattern configuring the inductor 83 is made thicker than the thickness of the IDT electrode 7 and a loss due to the provision of the inductors 83 can be reduced. From another viewpoint, the necessity of forming the inductor 83 with a broad width in order to reduce loss is reduced and consequently the probability of the size of the multiplexer 401 increasing is reduced. By configuring the inductor 83 by a conductor pattern 213 or 313 in this way, it is made easier to obtain a desired inductance while suppressing an increase of the size of the multiplexer 401.

The piezoelectric substrate 3 in the multiplexer 401 may be one bonded with a support substrate 4 (FIG. 5C) or may be one which is not bonded to the latter. However, in general, a piezoelectric substrate 3 which is bonded with a support substrate 4 is configured by a material by which it is more difficult to secure a broad passband compared with a piezoelectric substrate 3 which is not bonded with a support substrate 4. Therefore, the effects of the inductors 83 are high in usefulness in the case where the multiplexer 401 has a support substrate 4.

(Multiplexer (Quadplexer))

Figure 11:
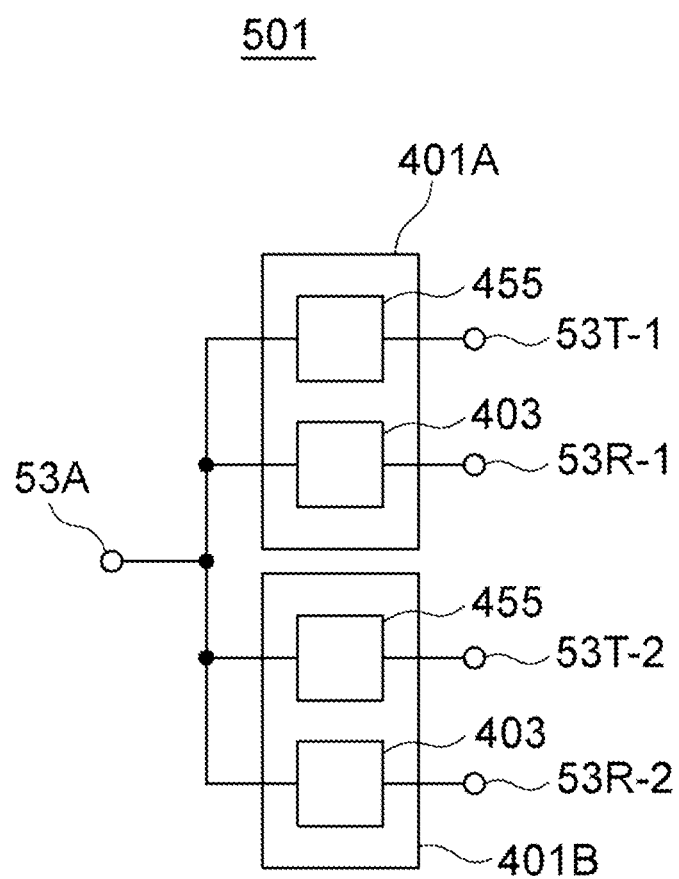
FIG. 11 is a view schematically showing another multiplexer.

FIG. 11 is a view schematically showing a multiplexer 501 as an example of utilization of the SAW filter 51.

The multiplexer 501 is configured as a quadplexer having four SAW filters 51 (455 or 403). More specifically, the multiplexer 501 is provided with two of a first multiplexer 401A and second multiplexer 401B (below, sometimes simply referred to as the "multiplexers 401") configured as duplexers. Each multiplexer 401 is for example the same as the multiplexer 401 explained with reference to FIG. 10.

The first multiplexer 401A is connected to the antenna terminal 53A, transmission terminal 53T-1, and reception terminal 53R-1 which correspond to the antenna terminal 53A, transmission terminal 53T, and reception terminal 53R in FIG. 10. In the same way, the second multiplexer 401B is connected to the antenna terminal 53A, transmission terminal 53T-2, and reception terminal 53R-2 which correspond to the antenna terminal 53A, transmission terminal 53T, and reception terminal 53R in FIG. 10. The antenna terminal 53A is shared by the two multiplexers 401, and the four filters (455 and 403) are connected to each other in a state where they are branched from each other.

The two multiplexers 401 may be provided on the same piezoelectric substrate 3 or be provided on piezoelectric substrates 3 which are different from each other.

Figure 12:
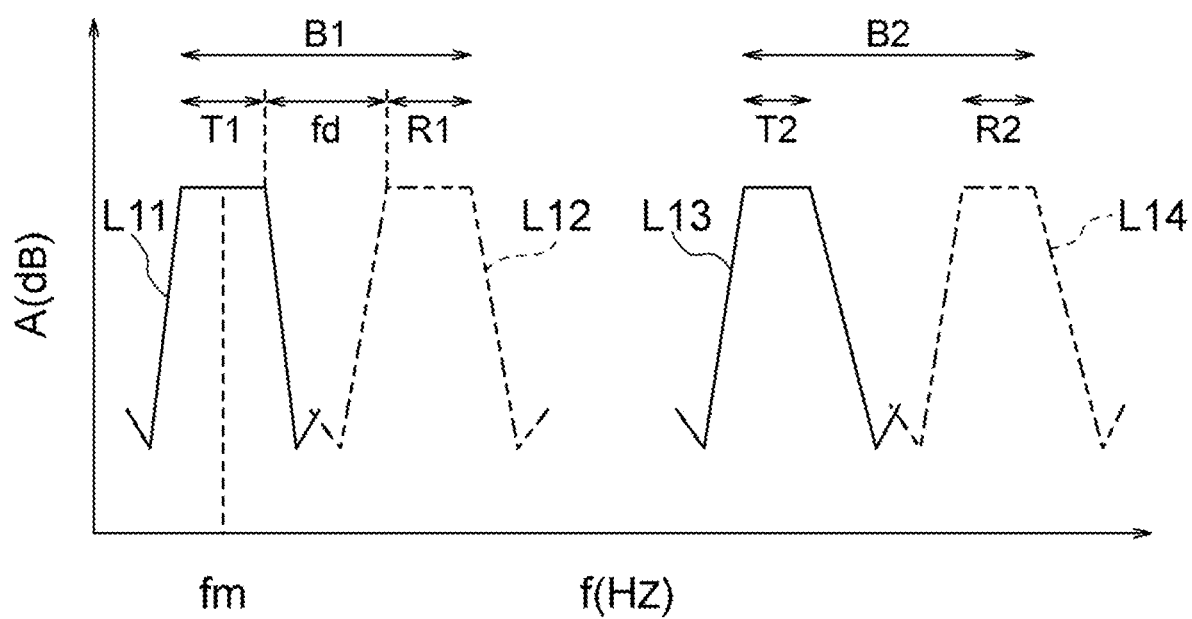
FIG. 12 is a view schematically showing a frequency band of the multiplexer in FIG. 11.

FIG. 12 is a graph showing the frequency characteristic of the multiplexer 501.

The abscissa shows the frequency "f" (Hz). The ordinate shows the attenuation amount A (dB). A line L11 indicates the frequency characteristic of the transmission filter 455 in the first multiplexer 401A. A line L12 indicates the frequency characteristic of the receiving filter 403 in the first multiplexer 401A. A line L13 indicates the frequency characteristic of the transmission filter 455 in the second multiplexer 401B. A line L14 indicates the frequency characteristic of the receiving filter 403 in the second multiplexer 401B.

In the first multiplexer 401A, the passband of the transmission filter 455 (first transmission band T1) is for example lower in frequency than the passband of the receiving filter 403 (first reception band R1). Further, in the second multiplexer 402B, the passband of the transmission filter 455 (second transmission band T2) is for example lower in frequency than the passband of the receiving filter 403 (second reception band R2). A first frequency band B1 including the first transmission band T1 and first reception band R1 is for example lower in frequency than a second frequency band B2 including the second transmission band T2 and second reception band R2.

In each multiplexer 401, as already explained, a broad passband is secured, while the isolation between the transmission filter 455 and the receiving filter 403 can be improved. The effect of improvement of the isolation is high in usefulness in a case where a width fd (transition bandwidth) of the band (transition band) between the two passbands is narrow. The transition bandwidth fd is the width of frequency from the upper limit value of the passband on a low frequency side (for example first transmission band T1) to the lower limit value of the passband on a high frequency side (for example first reception band R1). As the case where the transition bandwidth fd is narrow, for example, there can be mentioned a case where fd/fm×100(%) is 1.2% or less where the center frequency of the passband on a low frequency side (the frequency on just the middle between the upper limit value and the lower limit value of the passband) is fm. As the standard where fd/fm×100(%) becomes 1.2% or less, for example, there can be mentioned bands 2, 3, 8, and 25 in UMTS.

The receiving filter 403 in the first multiplexer 401A is configured by a ladder-type filter. Therefore, compared with the case where this receiving filter 403 is configured by a multiplex mode type filter, the steepness on a high frequency side of the first reception band R1 is improved. That is, the attenuation amount out of the band on a high frequency side of the first reception band R1 can be made larger. As a result, the isolation between the first reception band R1 and the second transmission band T2 is improved. On the other hand, the serial inductors 83S are provided in the receiving filter 403 in the first multiplexer 401A, therefore, it becomes easy to secure a passing bandwidth equal to that for the multiplex mode type filter by expanding the passband of this receiving filter 403.

The art of the present disclosure is not limited to the above embodiments and may be executed in various ways.

The acoustic wave is not limited to an SAW. For example, the acoustic wave may be a bulk wave propagating in the piezoelectric substrate or may be an elastic boundary wave propagating in a boundary portion between the piezoelectric substrate and an insulation layer covering the piezoelectric substrate (however, this is one type of SAW in a broad sense).

The direction of arrangement of the pluralities of electrode fingers in the additional resonator need not always coincide with the direction of propagation of the SAW.

The conductor layer having a broader area than the region where the pluralities of electrode fingers are arranged in the additional resonator is not limited to the reinforcing layer 311B. For example, the conductor layer may be provided on the upper surface of the piezoelectric substrate 3, may be provided on the lower surface of the piezoelectric substrate 3, or may be provided on the upper surface, in the internal portion, and on the lower surface of the facing substrate 203.

The conductor pattern which configures an inductor or capacitor and is provided in the package-use member is not limited to one provided in the internal portion of the facing substrate 203 or cover 303. For example, the conductor pattern may be provided on the surface of the facing substrate or cover. Further, the electronic component mounted in the package-use member configuring the inductor or capacitor is not limited to one mounted on the facing substrate 203. For example, the electronic component may be mounted on the upper surface of the cover 303 as well. Further, the electronic component may be positioned in the internal portion of the package-use member. For example, it may be arranged in a concave portion formed in the circuit board or cover.

The multiplexer is not limited to a duplexer having two filters or quadplexer having four filters. For example, the multiplexer may be a tri-plexer having three filters or may be one having five or more filters.

From the present disclosure, the following concepts can be extracted.

(First Concept)

A multiplexer including first to third filters which are connected to each other in a manner in which they are branched from each other, wherein the first filter is a ladder-type filter including one or more serial resonators and one or more parallel resonators, the second filter is a ladder-type filter including one or more serial resonators and one or more parallel resonators and has a higher passband frequency than the first filter, the third filter is higher in passband frequency than the second filter, the first filter includes an inductor which is connected in series to the parallel resonator, and the second filter includes an inductor which is connected in series to the serial resonator.

In the art of the first concept described above, the transmission filter 455 in the first multiplexer 401A is one example of the first filter. The receiving filter 403 in the first multiplexer 401A is one example of the second filter. The transmission filter 455 in the second multiplexer 401B is one example of the third filter. The parallel inductor 83P is one example of the inductor connected in series to the parallel resonator. The serial inductor 83S is one example of the inductor connected in series to the serial resonator.

In the art of the first concept described above, the additional resonator may be provided or may not be provided. The first to third filters may include the transmission filters or may not include them. When the transmission filters are included in the first to third filters, the initial stage resonator which is connected to the transmission terminal may be a serial resonator or parallel resonator. The third filter may be a filter other than a ladder-type filter.

REFERENCE SIGNS LIST

3 . . . piezoelectric substrate, 7 . . . IDT electrode, 51 . . . SAW filter (acoustic wave filter), 53T . . . transmission terminal, 53A . . . antenna terminal, 53G (53G-1 to 53G-3) . . . GND terminals, 55 . . . transmission filter, 57 . . . additional resonator, 65 (65A to 65D) . . . serial resonators, and 67 (67A to 67C) . . . parallel resonators.

The invention claimed is:
1. An acoustic wave filter comprising:
a substrate comprising a piezoelectric substrate,
a transmission terminal, an antenna terminal, and one or more reference potential terminals, which are located on the substrate,
a transmission filter of a ladder-type filter for filtering signals from the transmission terminal and for outputting the result to the antenna terminal, the transmission filter comprising one or more serial resonators and one or more parallel resonators connected in a ladder configuration on the piezoelectric substrate, wherein the transmission terminal is connected to a first serial resonator of the one or more serial resonators that is closest to the transmission terminal, and an additional resonator on the piezoelectric substrate, the additional resonator comprising an Interdigital transducer (IDT) electrode having a resonance frequency and antiresonance frequency located outside of a passband of the transmission filter, the IDT electrode connected to the transmission terminal at a stage before the transmission filter and connected to any of the one or more reference potential terminals, wherein the additional resonator configures a capacitor on a side closest to the transmission filter in a π-shaped low pass filter connected to the stage before the transmission filter, and wherein an electrostatic capacitance of the additional resonator is different from an electrostatic capacitance of any of one or more capacitors, other than the capacitor of the the additional resonator, which are comprised in the π-shaped low pass filter.

2. The acoustic wave filter according to claim 1, wherein the any one or more reference potential terminals connected with the IDT electrode of the additional resonator
is not a reference potential terminal of the one or more reference potential terminals that is connected through any of the one or more parallel resonators with the transmission terminal and the antenna terminal, and
is not short-circuited with any of the reference potential terminals of the one or more reference potential terminals that are connected through any of the one or more parallel resonators with the transmission terminal and the antenna terminal.

3. The acoustic wave filter according to claim 1, wherein an electrostatic capacitance of the additional resonator is different from an electrostatic capacitance of any of the one or more parallel resonators.

4. The acoustic wave filter according to claim 1, wherein the electrostatic capacitance of the additional resonator is smaller than the electrostatic capacitance of the any of the one or more capacitors.

5. The acoustic wave filter according to claim 1, wherein a passband of the transmission filter is located in a frequency range not more than 2.7 GHz.

6. The acoustic wave filter according to claim 1, further comprising a package-use member sealing the transmission filter, wherein at least one of an inductor and a capacitor other than the capacitor of the additional resonator of the π-shaped low pass filter is configured by a conductor pattern located in at least one of an internal portion and a surface of the package-use member.

7. The acoustic wave filter according to claim 1, further comprising a package-use member sealing the transmission filter, wherein at least one of an inductor and a capacitor other than the capacitor of the additional resonator of the π-shaped low pass filter is configured by an electronic component mounted in the package-use member.

8. A multiplexer comprising:
the acoustic wave filter according to claim 1,
a reception terminal, and
a receiving filter filtering signals from the antenna terminal and outputting the filtered signals a to the reception terminal.

9. A communication apparatus comprising:
an antenna,
the acoustic wave filter according to claim 1 wherein the antenna terminal is connected to the antenna, and
an integrated circuit (IC) connected to the transmission terminal.

10. An acoustic wave filter comprising:
a substrate comprising a piezoelectric substrate,
a transmission terminal, an antenna terminal, and one or more reference potential terminals, which are located on the substrate,
a transmission filter of a ladder-type filter for filtering signals from the transmission terminal and for outputting the result to the antenna terminal, the transmission filter comprising one or more serial resonators and one or more parallel resonators connected in a ladder configuration on the piezoelectric substrate, wherein the transmission terminal is connected to a first serial resonator of the one or more serial resonators that is closest to the transmission terminal,
an additional resonator on the piezoelectric substrate, the additional resonator comprising an Interdigital transducer (IDT) electrode having a resonance frequency and antiresonance frequency located outside of a passband of the transmission filter, the IDT electrode connected to the transmission terminal at a stage before the transmission filter and connected to any of the one or more reference potential terminals, and
a conductor layer which is short-circuited with the any of the one or more reference potential terminals connected with the additional resonator, the conductor layer comprising a broader area than a region where pluralities of electrode fingers are arranged of the IDT electrode in the additional resonator.

11. The acoustic wave filter according to claim 10, wherein the any one or more reference potential terminals connected with the IDT electrode of the additional resonator
is not a reference potential terminal of the one or more reference potential terminals that is connected through any of the one or more parallel resonators with the transmission terminal and the antenna terminal, and
is not short-circuited with any of the reference potential terminals of the one or more reference potential terminals that are connected through any of the one or more parallel resonators with the transmission terminal and the antenna terminal.

12. The acoustic wave filter according to claim 10, wherein the additional resonator configures a capacitor on a side closest to the transmission filter in a π-shaped low pass filter connected to the stage before the transmission filter.

13. The acoustic wave filter according to claim 10, wherein an electrostatic capacitance of the additional resonator is different from an electrostatic capacitance of any of the one or more parallel resonators.

14. An acoustic wave filter comprising:
a substrate comprising a piezoelectric substrate,
a transmission terminal, an antenna terminal, and one or more reference potential terminals, which are located on the substrate,
a transmission filter of a ladder-type filter for filtering signals from the transmission terminal and for outputting the result to the antenna terminal, the transmission filter comprising one or more serial resonators and one or more parallel resonators connected in a ladder configuration on the piezoelectric substrate, wherein the transmission terminal is connected to a first serial resonator of the one or more serial resonators that is closest to the transmission terminal,
an additional resonator on the piezoelectric substrate, the additional resonator comprising an Interdigital transducer (IDT) electrode having a resonance frequency and antiresonance frequency located outside of a passband of the transmission filter, the IDT electrode connected to the transmission terminal at a stage before the transmission filter and connected to any of the one or more reference potential terminals, and an insulator which
- covers only the additional resonator among the one or more serial resonators, the one or more parallel resonators, and the additional resonator, or
- is thicker only on the additional resonator among the one or more serial resonators, the one or more parallel resonators, and the additional resonator.

15. The acoustic wave filter according to claim 14, wherein the any one or more reference potential terminals connected with the IDT electrode of the additional resonator
- is not a reference potential terminal of the one or more reference potential terminals that is connected through any of the one or more parallel resonators with the transmission terminal and the antenna terminal, and
- is not short-circuited with any of the reference potential terminals of the one or more reference potential terminals that are connected through any of the one or more parallel resonators with the transmission terminal and the antenna terminal.

16. The acoustic wave filter according to claim 14, wherein the additional resonator configures a capacitor on a side closest to the transmission filter in a π-shaped low pass filter connected to the stage before the transmission filter.

17. The acoustic wave filter according to claim 14, wherein an electrostatic capacitance of the additional resonator is different from an electrostatic capacitance of any of the one or more parallel resonators.

18. An acoustic wave filter comprising:
a substrate comprising a piezoelectric substrate,
a transmission terminal, an antenna terminal, and one or more reference potential terminals, which are located on the substrate,
a transmission filter of a ladder-type filter for filtering signals from the transmission terminal and for outputting the result to the antenna terminal, the transmission filter comprising one or more serial resonators and one or more parallel resonators connected in a ladder configuration on the piezoelectric substrate, wherein the transmission terminal is connected to a first serial resonator of the one or more serial resonators that is closest to the transmission terminal, and an additional resonator on the piezoelectric substrate, the additional resonator comprising an Interdigital transducer (IDT) electrode having a resonance frequency and antiresonance frequency located outside of a passband of the transmission filter, the IDT electrode connected to the transmission terminal at a stage before the transmission filter and connected to any of the one or more reference potential terminals, wherein
- the one or more serial resonators are a plurality of serial resonators,
- at least one serial resonator of the plurality of serial resonators is divided into a plurality of divided resonators which are connected in series with each other, and
- a number of divisions of the first serial resonator of the at least one serial resonator on a side closest to the transmission terminal is larger than a number of divisions of another serial resonator of the at least one serial resonator on a side closest to the antenna terminal.

19. The acoustic wave filter according to claim 18, wherein the any one or more reference potential terminals connected with the IDT electrode of the additional resonator
- is not a reference potential terminal of the one or more reference potential terminals that is connected through any of the one or more parallel resonators with the transmission terminal and the antenna terminal, and
- is not short-circuited with any of the reference potential terminals of the one or more reference potential terminals that are connected through any of the one or more parallel resonators with the transmission terminal and the antenna terminal.

20. The acoustic wave filter according to claim 18, wherein the additional resonator configures a capacitor on a side closest to the transmission filter in a π-shaped low pass filter connected to the stage before the transmission filter.

* * * * *